US012610480B2

(12) United States Patent
Kim et al.

(10) Patent No.: US 12,610,480 B2
(45) Date of Patent: Apr. 21, 2026

(54) DISPLAY DEVICE

(71) Applicant: Samsung Display Co., LTD., Yongin-si (KR)

(72) Inventors: Donghyeon Kim, Yongin-si (KR); Hyeonji Kim, Yongin-si (KR); In Soo Park, Yongin-si (KR); Juyeop Seong, Yongin-si (KR); Jae-Soo Jang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 177 days.

(21) Appl. No.: 18/521,331

(22) Filed: Nov. 28, 2023

(65) Prior Publication Data

US 2024/0324123 A1 Sep. 26, 2024

(30) Foreign Application Priority Data

Mar. 22, 2023 (KR) ........................ 10-2023-0037567

(51) Int. Cl.
H05K 5/02 (2006.01)

(52) U.S. Cl.
CPC .................................. H05K 5/0217 (2013.01)

(58) Field of Classification Search
CPC ........................... H05K 5/0017; H05K 5/0217
USPC ....................................................... 361/807
See application file for complete search history.

(56) References Cited

U.S. PATENT DOCUMENTS

| | | | |
|---|---|---|---|
| 7,710,370 B2 * | 5/2010 | Slikkerveer | ......... H04M 1/0268 |
| | | | 345/31 |
| 9,772,657 B2 * | 9/2017 | Takayanagi | ......... H04M 1/0268 |
| 10,904,371 B1 * | 1/2021 | Song | ..................... G06F 1/1656 |
| 11,028,876 B2 | 6/2021 | Lee et al. | |
| 11,042,192 B2 | 6/2021 | Choi et al. | |
| 2018/0095551 A1 * | 4/2018 | Lindblad | ................ H10K 59/80 |
| 2020/0314225 A1 * | 10/2020 | Ahn | ..................... G06F 1/1652 |
| 2021/0274666 A1 * | 9/2021 | Kim | ....................... G09F 9/301 |

FOREIGN PATENT DOCUMENTS

| | | | |
|---|---|---|---|
| KR | 102089292 B1 | 3/2020 | |
| KR | 102255469 B1 | 5/2021 | |

* cited by examiner

*Primary Examiner* — Hung S. Bui
(74) *Attorney, Agent, or Firm* — CANTOR COLBURN LLP

(57) ABSTRACT

A display device includes: a display module including a first portion and a second portion extending in a first direction from the first portion; a support plate disposed on a rear surface of the first portion; a plurality of support bars disposed on a rear surface of the second portion, extending in a second direction crossing the first direction, and arranged in the first direction; a plurality of link bars connected to first sides and second sides of the support bars, which are opposite to each other in the second direction, and extending onto rear surfaces of the support bars; and a plurality of guide rails disposed further to the inside than the link bars, on the rear surfaces of the support bars, and coupled to the link bars.

19 Claims, 23 Drawing Sheets

ELm  SLm  CNL

DA

NDA

PL1

PL2

EDV

SDV

DL1

DLn

SL1  EL1

PX

CSL1

CSL2

AMP

DDV  PD

DISPLAY DEVICE

This application claims priority to Korean Patent Application No. 10-2023-0037567, filed on Mar. 22, 2023, and all the benefits accruing therefrom under 35 U.S.C. § 119, the content of which in its entirety is herein incorporated by reference.

BACKGROUND

The present disclosure herein relates to a display device.

In general, electronic devices such as smartphones, digital cameras, laptop computers, navigation systems, and smart televisions which provide images to users include a display device for displaying images. The display device generates images and provides the images to users through a display screen.

Along with the advancement of the display device, various forms of display devices are under development. For example, a flexible display device that may be slid or rolled to extend outside a case is being developed. The flexible display devices that are deformable into various forms may allow ease of portability and increase user-friendliness.

The flexible display devices include a flexible display module. The display module is accommodated in a case, and if necessary, may be drawn therefrom and extend to the outside thereof. A support portion for supporting the display module is disposed below the display module. There is a need to develop a support portion for readily supporting the display module.

SUMMARY

The present disclosure provides a display device capable of reducing a bezel region and more firmly fixing link bars connected to support bars.

An embodiment of the invention provides a display device including: a display module including a first portion and a second portion extending in a first direction from the first portion; a support plate disposed on a rear surface of the first portion; a plurality of support bars disposed on a rear surface of the second portion, extending in a second direction crossing the first direction, and arranged in the first direction: a plurality of link bars connected to first sides and second sides of the support bars, which are opposite to each other in the second direction and extending onto rear surfaces of the support bars; and a plurality of guide rails disposed further to the inside than the link bars, on the rear surfaces of the support bars, and coupled to the link bars.

In an embodiment of the invention, a display device includes: a display module including a first portion and a second portion extending in a first direction from the first portion: a support plate disposed on a rear surface of the first portion; a plurality of support bars disposed on a rear surface of the second portion: a plurality of link bars connected to opposite sides of the support bars and extending onto rear surfaces of the support bars; and a plurality of guide rails disposed further to the inside than the link bars, on the rear surfaces of the support bars, and having a portion in a curved shape, where the guide rails are inserted into binding grooves defined in the link bars.

In an embodiment of the invention, a display device includes: a display module including a first portion and a second portion extending in a first direction from the first portion: a support plate disposed on a rear surface of the first portion: a plurality of support bars disposed on a rear surface of the second portion, extending in a second direction crossing the first direction, and arranged in the first direction: a plurality of link bars connected to rear surfaces of the support bars: a plurality of body portions disposed on the rear surfaces of the support bars; and a plurality of guide rails protruding from both sides of the body portions, which are opposite to each other in the second direction, where the link bars are coupled to the guide rails to move along the guide rails.

BRIEF DESCRIPTION OF THE FIGURES

The accompanying drawings are included to provide a further understanding of the invention, and are incorporated in and constitute a part of this specification. The drawings illustrate embodiments of the invention and, together with the description, serve to explain principles of the invention. In the drawings:

FIG. 3 is a perspective view of a display module accommodated in a case shown in FIG. 1:

FIG. 11 is a view showing a folded state of a display module shown in FIG. 9:

FIG. 22A is a cross-sectional view of line VI-VI' shown in FIG. 15 and is a view showing an extended mode of the display device shown in FIG. 2:

DETAILED DESCRIPTION

Figure 1:
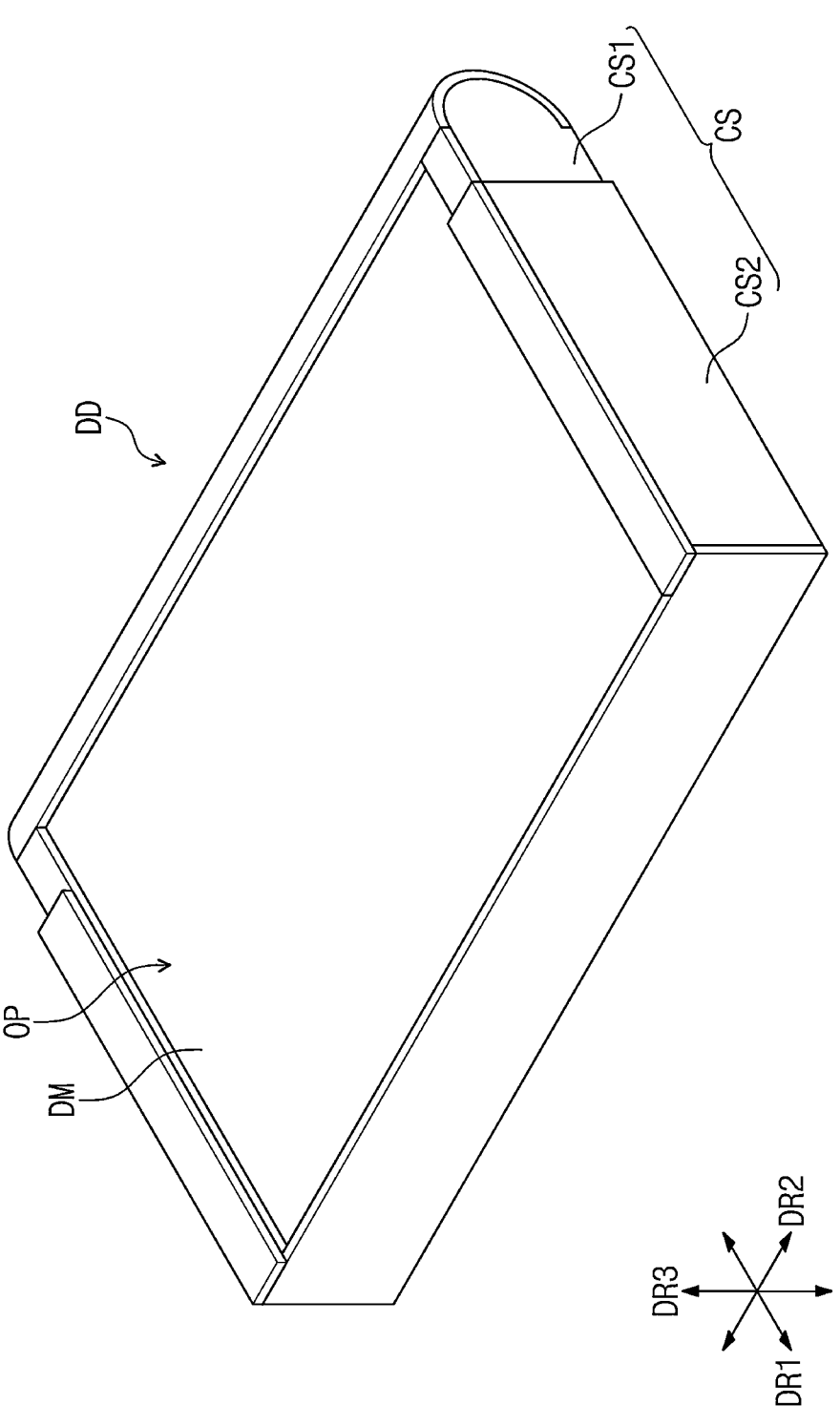
FIG. 1 is a perspective view of a display device according to an embodiment of the invention.

As used herein, when an element (or a region, a layer, a portion, etc.) is referred to as being "on", "connected to", or "coupled to" another element, it means that the element may be directly disposed on/connected to/coupled to the other element, or that a third element may be disposed therebetween.

Like reference numerals refer to like elements. In addition, in the drawings, the thickness, the ratio, and the dimensions of elements are exaggerated for an effective description of technical contents.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or," The term "and/or," includes all combinations of one or more of which associated configurations may define.

Although the terms "first", "second", etc. may be used herein to describe various elements, these elements should not be limited by these terms. These terms are only used to distinguish one element from another element. For example, a first element may be referred to as a second element, and similarly, a second element may be referred to as a first element without departing from the teachings of the present disclosure. The singular forms are intended to include the plural forms as well, unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

Unless otherwise defined, all terms (including technical and scientific terms) used herein have the same meaning as commonly understood by one of ordinary skill in the art to which the present disclosure belongs. In addition, terms, such as those defined in commonly used dictionaries, should be interpreted as having a meaning that is consistent with their meaning in the context of the relevant art and should not be interpreted in an idealized or overly formal sense unless expressly so defined herein.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof.

Hereinafter, embodiments of the invention will be described with reference to the drawings.

Figure 2:
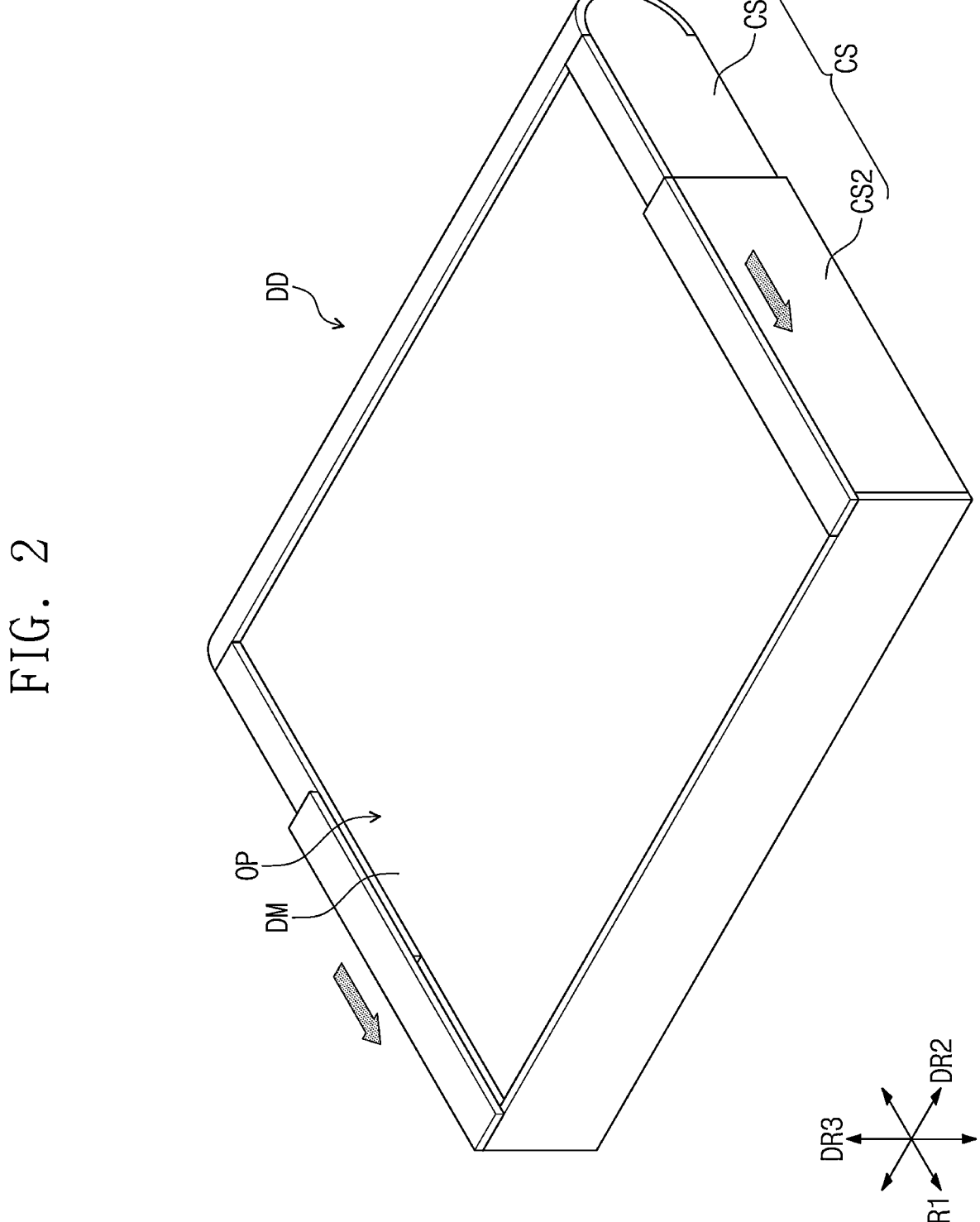
FIG. 2 is a view for describing an extended mode of a display device shown in FIG. 1.

FIG. 1 is a perspective view of a display device according to an embodiment of the invention. FIG. 2 is a view for describing an extended mode of a display device shown in FIG. 1.

Referring to FIG. 1, a display device DD according to an embodiment of the invention may include a display module DM and a case CS accommodating the display module DM. The display module DM may be exposed to the outside through an opening OP defined at an upper portion of the case CS.

The case CS may include a first case CS1 and a second case CS2, which are coupled together to accommodate the display module DM. The first case CS1 and the second case CS2 may be coupled together to move in a first direction DR1.

Hereinafter, a direction crossing the first direction DR1 is defined as a second direction DR2. A direction substantially perpendicular to a plane defined by the first and second directions DR1 and DR2 is defined as a third direction DR3. As used herein, "when viewed on a plane" may be defined as viewed from the third direction DR3, which has the same meaning with "plan view".

A more detailed configuration of the first and second cases CS1 and CS2 will be described in detail with reference to an exploded perspective view of the case CS shown in FIG. 15.

Referring to FIGS. 1 and 2, the first case CS1 and the second case CS2 may move away from or close to each other along the first direction DR1. An area of an exposed surface of the display module DM may be regulated according to the movement of the first case CS1 and the second case CS2.

The display module DM may be a flexible display module and may be supported by a support portion (hereinafter shown in FIG. 9) disposed below the display module DM. A detailed structure of the support portion will be described in detail with reference to FIG. 9 below.

The display module DM and the support portion may be accommodated in the first case CS1 and the second case CS2. The display module DM and the support portion may be connected to the second case CS2, and when the second case CS2 moves from the first case CS1 along the first direction DR1, the display module DM and the support portion may also move in the first direction DR1.

Although not shown, a portion of the display module DM, which is not exposed to the outside other than a portion of the display module DM, which is exposed through the opening OP may be disposed within the first case CS1.

Referring to FIG. 2, the second case CS2 may move in the first direction DR1 to be away from the first case CS1. The display module DM moves in the first direction DR1 according to the movement of the second case CS2, and as a result, the exposed surface of the display module DM may extend.

As the exposed surface of the display module DM extends, users may view images through a larger screen. A state of the display device DD in which the exposed surface of the display module DM extends may be defined as an extended mode.

Referring to FIG. 1, the second case CS2 may move in the first direction DR1 to be closer to the first case CS1. When the second case CS2 moves toward the first case CS1 to the maximum, the exposed surface of the display module DM may be set to the minimum. The state of the display device DD may be defined as a basic mode. As the second case CS2 moves, both the basic mode and the extended mode of the display device DD may be workable.

Figure 3:
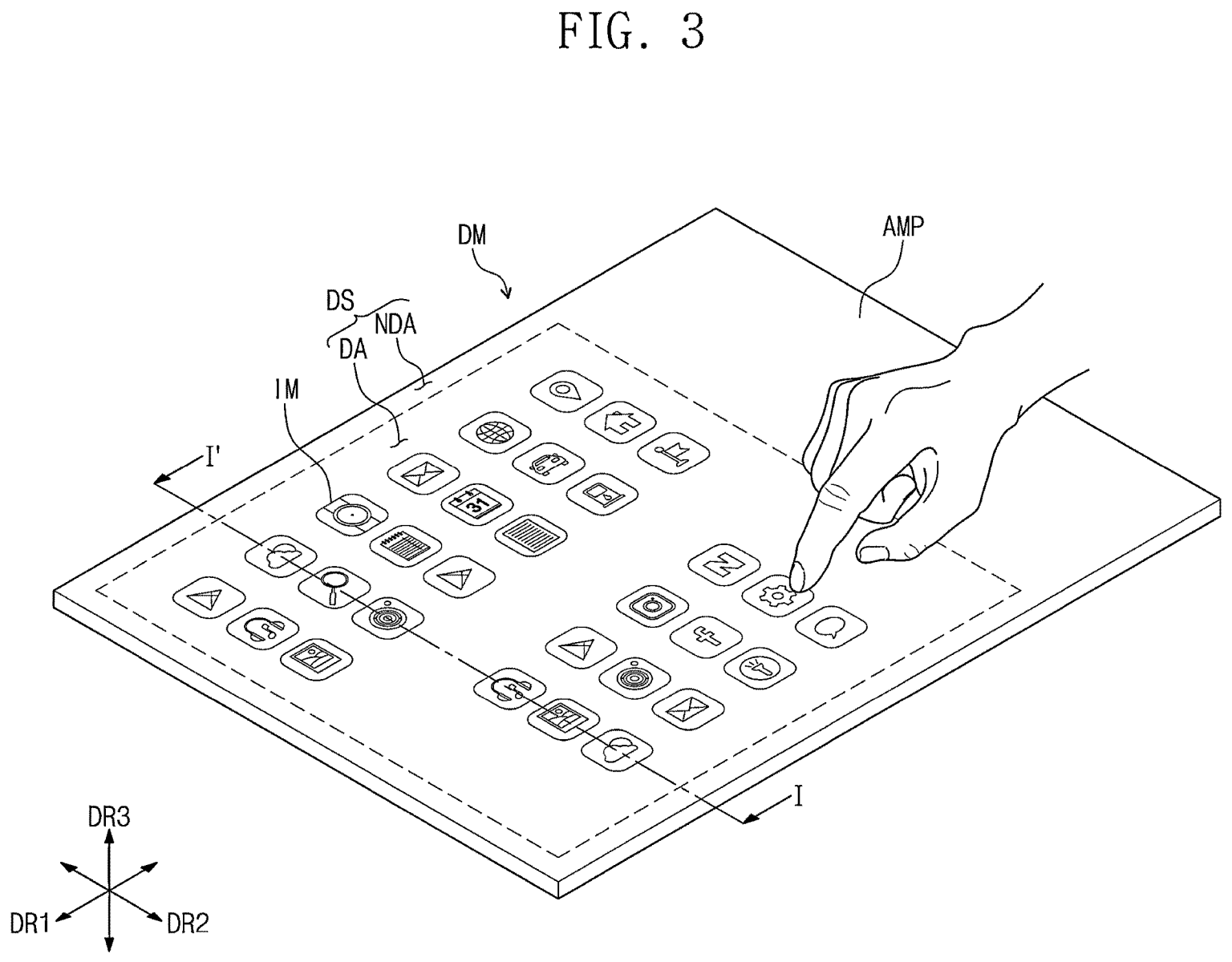
Figure 4:
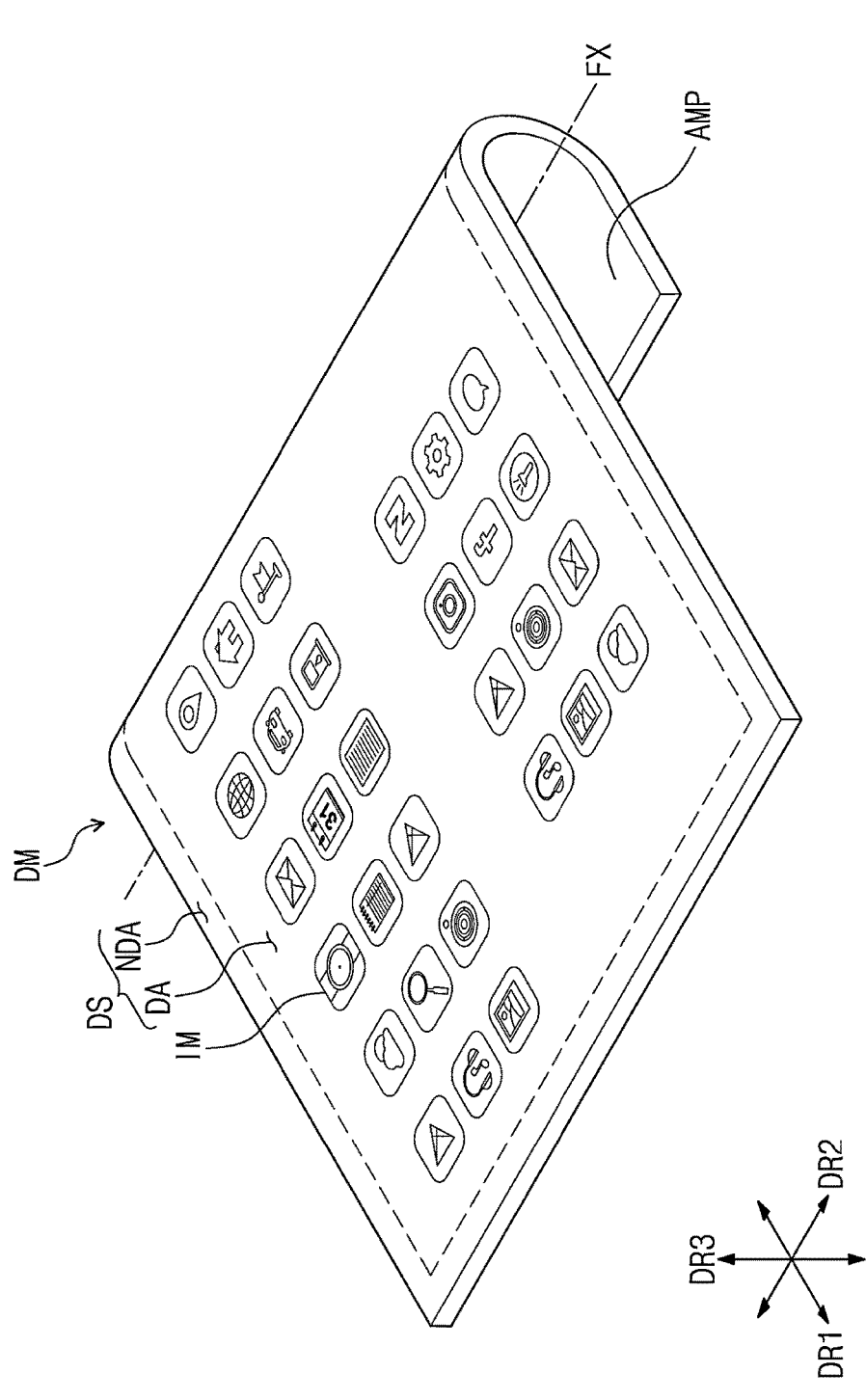
FIG. 4 is a view showing a folded state of a display module shown in FIG. 3.

FIG. 3 is a perspective view of a display module accommodated in a case shown in FIG. 1. FIG. 4 is a view showing a folded state of a display module shown in FIG. 3.

Referring to FIG. 3, the display module DM may have a rectangular shape with sides extending in the first and second directions DR1 and DR2. However, the embodiment of the invention is not limited thereto, and the display module DM may have various shapes such as a circular shape and a polygonal shape.

An upper surface of the display module DM may be defined as a display surface DS, and may have a plane defined by the first direction DR1 and the second direction DR2. Images IM generated in the display module DM may be provided to users through the display surface DS.

The display surface DS may include a display region DA and a non-display region NDA around the display region DA. The display region DA may display images, and the non-display region NDA may not display images. The non-display region NDA may surround the display region DA, and may define an edge of the display module DM printed in a predetermined color.

The display module DM may detect inputs applied from the outside. For example, the display module DM may detect a user's touch as an external input and display images corresponding to the detected signals.

The display module DM may include an accommodation portion AMP adjacent to the display region DA. The accommodation portion AMP may be adjacent to one side of both sides of the display module DM, which are opposite to each other in the first direction DR1. The accommodation portion AMP may be substantially the non-display region NDA. The accommodation portion AMP may be defined as the non-display region NDA adjacent to one side of the display module DM.

The accommodation portion AMP may have a greater area than the non-display region NDA adjacent to both sides of the display module DM, which are opposite to each other in the second direction DR2 and the non-display region NDA adjacent to the other side of the display module DM in the first direction DR1.

Referring to FIGS. 1 and 4, the display module DM may be a flexible display module. The display module DM may be folded with respect to a folding axis FX extending in the second direction DR2 and accommodated in the case CS. The display region DA of the display module DM may be exposed to the outside through the opening OP. As the second case CS2 moves, an area of the display region DA, which is exposed to the outside may be regulated.

When the display module DM is folded, the accommodation portion AMP may be accommodated in the case CS and may not be exposed to the outside. A driver for driving elements of the display module DM may be disposed in the accommodation portion AMP.

Figure 5:
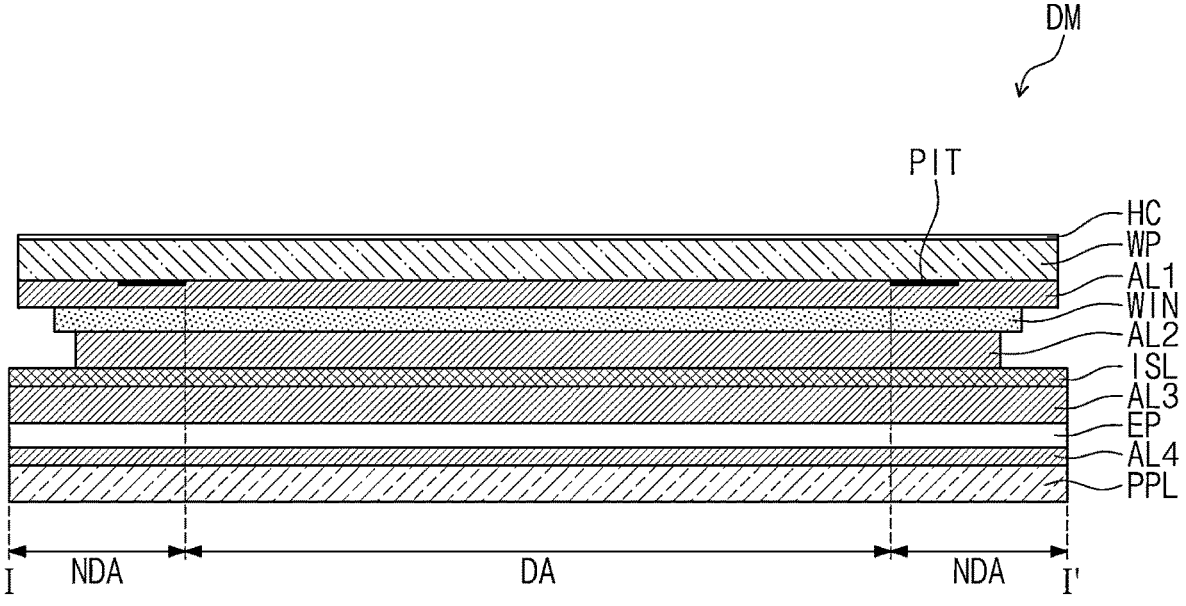
FIG. 5 is a cross-sectional view of line I-I' shown in FIG. 3.
Figure 5:
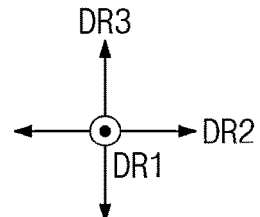

FIG. 5 is a cross-sectional view of line I-I' shown in FIG. 3.

Referring to FIG. 5, the display module DM may include an electronic panel EP, a shock absorption layer ISL, a panel protection layer PPL, a window WIN, a window protection layer WP, a hard coating layer HC, and first to fourth adhesive layers AL1 to AL4.

The electronic panel EP may display images. The electronic panel EP may include a display panel, an input sensing portion, and an antireflection layer, and the components of the electronic panel EP will be described later with reference to FIG. 6.

The shock absorbing layer ISL may be disposed on the electronic panel EP. The shock absorbing layer ISL may absorb external shocks applied from the top of the display device DD toward the electronic panel EP to protect the electronic panel EP. The shock absorbing layer ISL may be prepared in the form of a stretched film.

The shock absorbing layer ISL may include a flexible plastic material. The flexible plastic material may be defined as a synthetic resin film. For example, the shock absorbing layer ISL may include a flexible plastic material such as polyimide ("PI") or polyethylene terephthalate ("PET").

The window WIN may be disposed on the shock absorbing layer ISL. The window WIN may protect the electronic panel EP from external scratches. The window WIN may have optically transparent properties. The window WIN may include glass. However, the embodiment of the invention is not limited thereto, and the window WIN may include a synthetic resin film in another embodiment.

The window protection layer WP may be disposed on the window WIN. The window protection layer WP may include a flexible plastic material such as polyimide or polyethylene terephthalate. The hard coating layer HC may be disposed on an upper surface of the window protection layer WP.

A print layer PIT may be disposed on a lower surface of the window protection layer WP. The print layer PIT may be black, but the color of the print layer PIT is not limited thereto. The print layer PIT may be adjacent to the edge of the window protection layer WP. The print layer PIT may overlap the non-display region NDA.

The panel protection layer PPL may be disposed below the electronic panel EP. The panel protection layer PPL may protect a lower portion of the electronic panel EP. The panel protection layer PPL may include a flexible plastic material. For example, the panel protection layer PPL may include polyimide or polyethylene terephthalate.

The first adhesive layer AL1 may be disposed between the window protection layer WP and the window WIN. By the first adhesive layer AL1, the window protection layer WP and the window WIN may be bonded to each other. The first adhesive layer AL1 may cover the print layer PIT.

The second adhesive layer AL2 may be disposed between the window WIN and the shock absorbing layer ISL. By the second adhesive layer AL2, the window WIN and the shock absorbing layer ISL may be bonded to each other.

The third adhesive layer AL3 may be disposed between the shock absorbing layer ISL and the electronic panel EP. By the third adhesive layer AL3, the shock absorbing layer ISL and the electronic panel EP may be bonded to each other.

The fourth adhesive layer AL4 may be disposed between the electronic panel EP and the panel protection layer PPL. By the fourth adhesive layer AL4, the electronic panel EP and the panel protection layer PPL may be bonded to each other.

The first to fourth adhesive layers AL1 to AL4 may include a pressure sensitive adhesive ("PSA") or an optically clear adhesive ("OCA"), but the type of the adhesive is not limited thereto.

Figure 6:
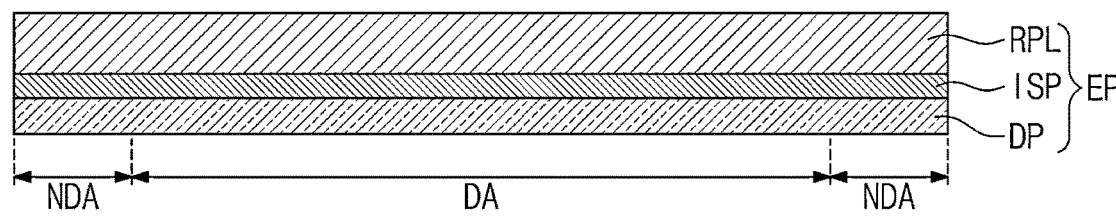
FIG. 6 is a cross-sectional view of an electronic panel, showing components of an electronic panel shown in FIG. 5.
Figure 6:
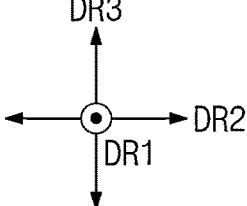

FIG. 6 is a cross-sectional view of an electronic panel, showing components of an electronic panel shown in FIG. 5.

As an example, a cross section of the electronic panel EP viewed from the first direction DR1 is shown in FIG. 6.

Referring to FIG. 6, the electronic panel EP may include a display panel DP, an input sensing portion ISP disposed on the display panel DP, and an antireflection layer RPL disposed on the input sensing portion ISP. The display panel DP may be a flexible display panel. For example, the display panel DP may include a flexible substrate and a plurality of elements disposed on the flexible substrate.

The display panel DP according to an embodiment of the invention may be a light emitting display panel, and is not particularly limited. For example, the display panel DP may be an organic light emitting display panel or an inorganic light emitting display panel. An emission layer of the organic light emitting display panel may include an organic light emitting material. An emission layer of the inorganic light emitting display panel may include quantum dots, quantum rods, etc. Hereinafter, the display panel DP is described as an organic light emitting display panel.

The input sensing portion ISP may include a plurality of sensor portions (not shown) for detecting external inputs. As an example, the input sensing portion ISP may detect external inputs in a capacitive manner, but the sensing method of the input sensing portion ISP is not limited thereto. The input sensing unit ISP may be directly formed on the display panel DP when the electronic panel EP is manufactured.

The antireflection layer RPL may be disposed on the input sensing portion ISP. The antireflection layer RPL may be directly formed on the input sensing portion ISP when the electronic panel EP is manufactured. The antireflection layer RPL may be defined as an external light antireflection film. The antireflection layer RPL may reduce the reflectance of external light incident from the top of the display device DD toward the display panel DP.

When the external light incident toward the display panel DP is reflected from the display panel DP and provided back to external users, like a mirror, the users may view the external light. In order to prevent the above phenomenon, as an example, the antireflection layer RPL may include a plurality of color filters displaying the same color as pixels of the display panel DP.

The color filters may filter the external light to the same color as the pixels. In this case, the external light may not be viewed by the users. However, the embodiment of the invention is not limited thereto, and the reflection prevention layer RPL may include a phase retarder and/or a polarizer to reduce the reflectance of the external light in another embodiment.

As an example, the input sensing portion ISP may be directly formed on the display panel DP and the antireflection layer RPL may be directly formed on the input sensing portion ISP, but the embodiment of the invention is limited thereto. For example, the input sensing portion ISP may be separately manufactured and attached to the display panel DP by an adhesive layer, and the antireflection layer RPL may be separately manufactured and attached to the input sensing portion ISP by an adhesive layer.

Figure 7:
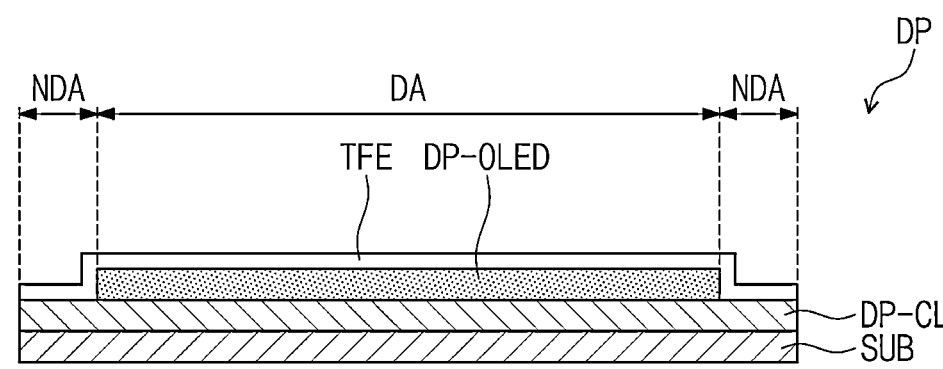
FIG. 7 is a cross-sectional view of a display panel, showing components of a display panel shown in FIG. 6.
Figure 7:
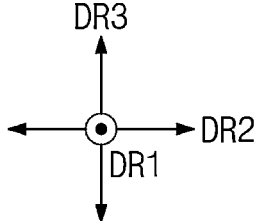

FIG. 7 is a cross-sectional view of a display panel, showing components of a display panel shown in FIG. 6.

As an example, a cross section of the display panel DP viewed from the first direction DR1 is shown in FIG. 7.

Referring to FIG. 7, the display panel DP may include a substrate SUB, a circuit element layer DP-CL disposed on the substrate SUB, a display element layer DP-OLED disposed on the circuit element layer DP-CL, and a thin film encapsulation layer TFE disposed on the display element layer DP-OLED.

The substrate SUB may include a display region DA and a non-display region NDA around the display region DA. The substrate SUB may include a flexible plastic material such as polyimide. The display element layer DP-OLED may be disposed on the display region DA.

A plurality of pixels may be disposed in the display region DA. The pixels PX may each include a light emitting element connected to a transistor disposed on the circuit element layer DP-CL and disposed on the display element layer DP-OLED.

The thin film encapsulation layer TFE may be disposed on the circuit element layer DP-CL to cover the display element layer DP-OLED. The thin film encapsulation layer TFE may include inorganic layers and an organic layer between the inorganic layers. The inorganic layers may protect pixels from moisture/oxygen. The organic layer may protect pixels from foreign substances such as dust particles.

Figure 8:
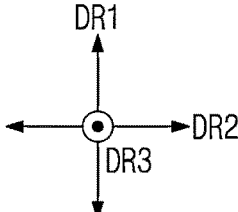
FIG. 8 is a plan view of the display panel shown in FIG. 7.

FIG. 8 is a plan view of the display panel shown in FIG. 7.

Referring to FIG. 8, the display device DD may include a display panel DP, a scan driver SDV, a data driver DDV, and a light emission driver EDV, and a plurality of pads PD.

The display panel DP may have a rectangular shape with sides extending in the first and second directions DR1 and DR2, but the shape of the display panel DP is not limited thereto. The display panel DP may include a display region DA and a non-display region NDA around the display region DA.

The display panel DP may include a plurality of pixels PX, a plurality of scan lines SL1 to SLm, a plurality of data lines DL1 to DLn, a plurality of light emission lines EL1 to ELm, first and second control lines CSL1 and CSL2, first and second power lines PL1 and PL2, and a plurality of connection lines CNL. m and n are natural numbers.

The pixels PX may be disposed in the display region DA. The scan driver SDV and the light emission driver EDV may be disposed in the non-display region NDA adjacent to each of both sides of the display panel DP, which are opposite to each other in the second direction DR2. The data driver DDV may be disposed in the non-display region NDA adjacent to one side of both sides of the display panel DP, which are opposite to each other in the first direction DR1. When viewed on a plane, the data driver DDV may be adjacent to a lower end of the display panel DP.

In FIG. 8, the accommodating portion AMP may be defined as the non-display region NDA adjacent to the lower end of the display panel DP. The data driver DDV may be disposed in the accommodation portion AMP.

The scan lines SL1 to SLm may extend in the second direction DR2 and be connected to the pixels PX and the scan driver SDV. The data lines DL1 to DLn may extend in the first direction DR1, and be connected to the pixels PX and the data driver DDV. The light emission lines EL1 to ELm may extend in the second direction DR2 and be connected to the pixels PX and the light emission driver EDV.

The first power line PL1 may extend in the first direction DR1 and be disposed in the non-display region NDA. The first power line PL1 may be disposed between the display region DA and the light emission driver EDV.

The connection lines CNL may extend in the second direction DR2 and be arranged in the first direction DR1 to be connected to the first power line PL1 and the pixels PX. A first voltage may be applied to the pixels PX through the first power line PL1 and the connection lines CNL connected to each other.

The second power line PL2 may be disposed in the non-display region NDA and may extend along the long sides of the display panel DP and the other one short side of the display panel DP on which the data driver DDV is not disposed. The second power line PL2 may be disposed further to the outside than the scan driver SDV and the emission driver EDV.

Although not shown, the second power line PL2 may extend toward the display region DA and be connected to the pixels PX. A second voltage having a lower level than the first voltage may be applied to the pixels PX through the second power line PL2.

The first control line CSL1 may be connected to the scan driver SDV and may extend toward a lower end of the display panel DP. The second control line CSL2 may be connected to the light emission driver EDV and may extend toward a lower end of the display panel DP. The data driver DDV may be disposed between the first control line CSL1 and the second control line CSL2.

The pads PD may be disposed in the non-display region NDA adjacent to the lower end of the display panel DP and may be closer to the lower end of the display panel DP than the data driver DDV. The data driver DDV, the first power line PL1, the second power line PL2, the first control line CSL1, and the second control line CSL2 may be connected to the pads PD. The data lines DL1 to DLn may be connected to the data driver DDV, and the data driver DDV may be connected to the pads PD corresponding to the data lines DL1 to DLn.

Although not shown, the display device DD may include a timing controller to control operations of the scan driver SDV, data driver DDV, and light emission driver EDV, and a voltage generator to generate the first and second voltages. The timing controller and the voltage generator may be connected to the pads PD through a printed circuit board.

The scan driver SDV may generates a plurality of scan signals, and the scan signals may be applied to the pixels PX through the scan lines SL1 to SLm. The data driver DDV may generate a plurality of data voltages, and the data voltages may be applied to the pixels PX through the data lines DL1 to DLn. The light emission driver EDV may generate a plurality of light emitting signals, and the light emitting signals may be applied to the pixels PX through the light emission lines EL1 to ELm.

The pixels PX may be provided with the data voltages in response to the scan signals. The pixels PX may display images by emitting light of luminance corresponding to the data voltages in response to the light emitting signals.

Figure 9:
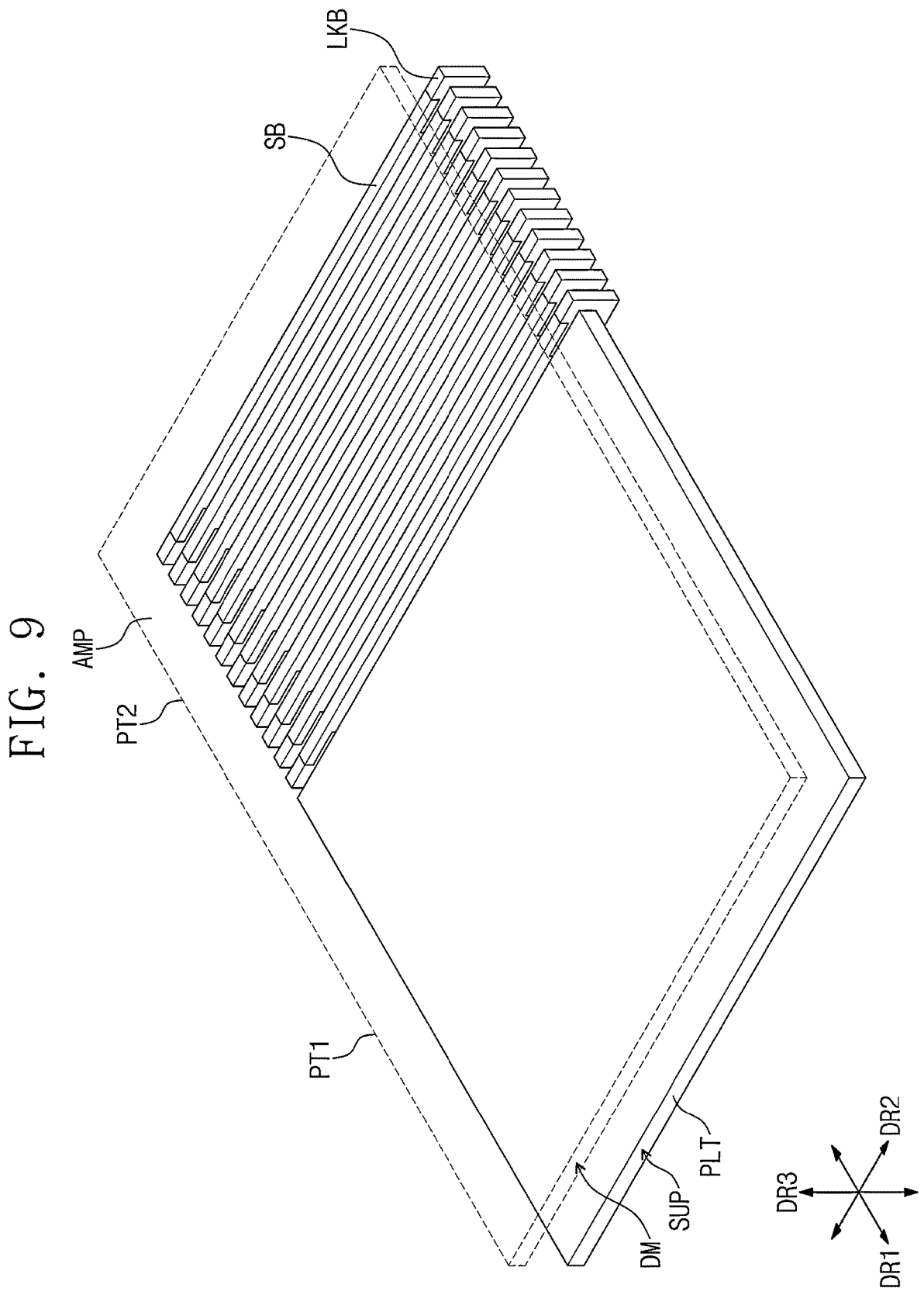
FIG. 9 is a perspective view of a support portion supporting the display module shown in FIG. 3.

FIG. 9 is a perspective view of a support portion supporting the display module shown in FIG. 3.

As an example, in FIG. 9, the display module DM disposed on the support portion SUP is shown together with the support portion SUP, and the display module DM is shown in dotted line.

Referring to FIG. 9, the support portion SUP may be disposed below the display module DM. A front surface of the display module DM may be the display surface DS described above. The support portion SUP may be disposed on a rear surface of the display module DM, which is opposite to the front surface of the display module DM.

The support portion SUP may be attached to the display module DM. For example, an adhesive may be disposed between the support portion SUP and the display module DM, and the support portion SUP and the display module DM may thus be bonded together. The adhesive may include an acrylic resin. An adhesive strength of the adhesive may be improved at a high temperature of about 70° C. to about 80° C. The support portion SUP and the display module DM may be bonded together by an adhesive at a temperature of about 0° C. to about 80° C.

The support portion SUP may include a support plate PLT, a plurality of support bars SB, and a plurality of link bars LKB. The support plate PLT may have a plane defined by the first and second directions DR1 and DR2.

The support bars SB may be arranged in the first direction DR1 and may extend in the second direction DR2. The support bars SB may be arranged in the first direction DR1 with respect to the support plate PLT.

Half of the link bars LKB may be connected to first sides of the support bars SB, and the other half of the link bars LKB may be connected to second sides of the support bars SB. The first sides of the support bars SB and the second sides of the support bars SB may define both sides of the support bars SB, which are opposite to each other in the second direction DR2. The link bars LKB connected to the first sides of the support bars SB and the link bars LKB connected to the second sides of the support bars SB may have a shape symmetrical in the second direction DR2.

The support plate PLT, the support bars SB, and the link bars LKB may include a metal material. For example, the support plate PLT, the support bars SB, and the link bars LKB may include stainless steel, but the metal materials of the support plate PLT, the support bars SB, and the link bars LKB are not limited thereto. The Support bars SB and link bars LKB including metal materials may be connected to each other by a welding process.

When viewed on a plane, the display module DM may include a first portion PT1 overlapping the support plate PLT and a second portion PT2 overlapping the support bars SB and link bars LKB. The second portion PT2 may extend in the first direction DR1 from the first portion PT1.

The support plate PLT may be disposed on a rear surface of the first portion PT1. The support bars SB and link bars LKB may be disposed on a rear surface of the second portion PT2. The support plate PLT may be attached to the rear surface of the first portion PT1 by the adhesive described above, and the support bars SB and link bars LKB may be attached to the rear surface of the second portion PT2 by the adhesive described above.

Figure 10:
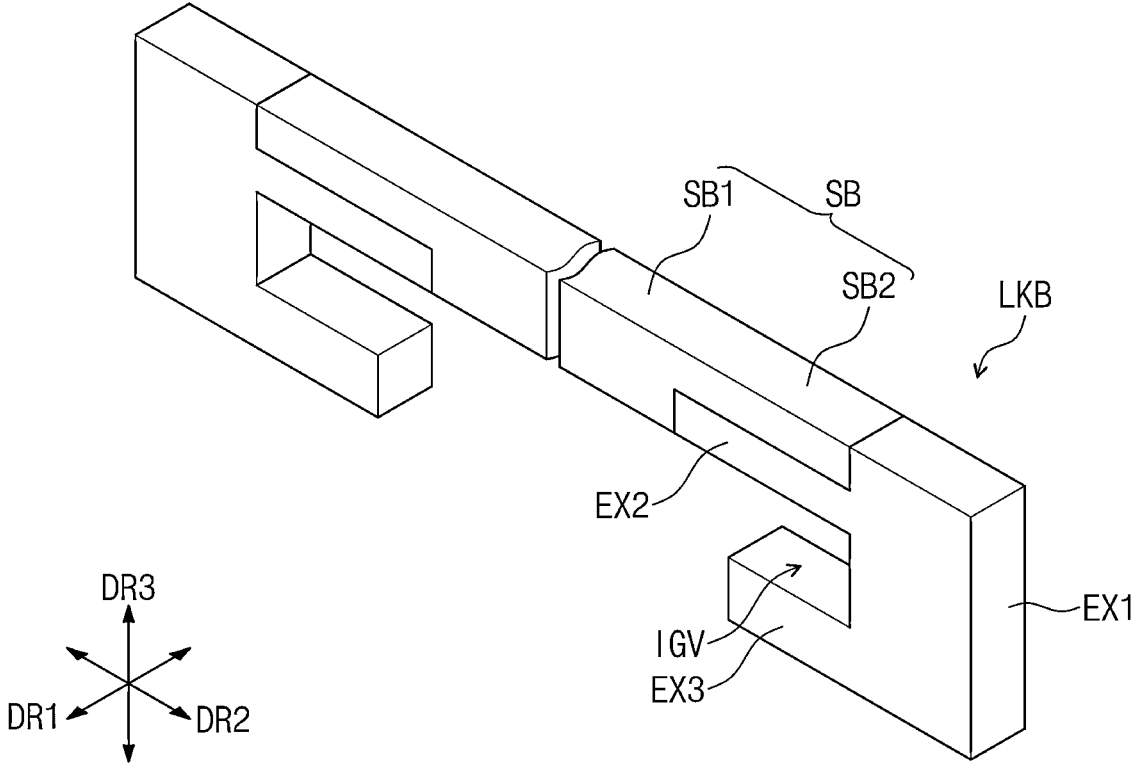
FIG. 10 is an enlarged view of link bars connected to any one support bar shown in FIG. 9.

FIG. 10 is an enlarged view of link bars connected to any one support bar shown in FIG. 9.

Referring to FIG. 10, the link bars LKB may be connected to one side and the other side of a corresponding support bar SB of the support bars SB, and may extend onto a rear surface of a support bar SB, which is opposite to a front side of the support bar SB. The front and rear surfaces of the support bar SB may be surfaces opposite to each other in the third direction DR3. The front surface of the support bar SB may be defined as a surface facing the display module DM shown in FIG. 9.

The link bar LKB connected to one side of the support bar SB and the link bar LKB connected to the other side of the support bar SB are symmetrical to each other and may have substantially the same shape. Accordingly, components of the link bar LKB connected to one side of the support bar SB will be described below.

The link bar LKB may include a first extension portion EX1, a second extension portion EX2, and a third extension portion EX3. The first extension portion EX1 may extend in the third direction DR3.

The second extension portion EX2 may extend in the second direction DR2 from a portion of the first extension portion EX1. For example, the second extension portion EX2 may extend from a portion of the first extension portion EX1 adjacent to an upper end of the first extension portion EX1. The upper end of the first extension portion EX1 may face the display module DM shown in FIG. 9.

The third extension portion EX3 may extend in the second direction DR2 from the other portion of the first extension portion EX1 and be disposed below the second extension portion EX2. For example, the third extension portion EX3 may extend from a lower end of the first extension portion EX1. The lower end of the first extension portion EX1 may be disposed opposite to the upper end of the first extension portion EX1. The third extension portion EX3 may face the second extension portion EX2 in the third direction DR3.

A space between the first extension portion EX1, the second extension portion EX2, and the third extension portion EX3 may be defined as a binding groove IGV. A guide rail which will be described later may be inserted into the binding groove IGV, and this configuration will be described in detail below. The first extension portion EX1 may be connected to one side of the support bar SB by the welding process described above. The second extension portion EX2 may be attached to the rear surface of the support bar SB adjacent to one side of the support bar SB by the welding process described above.

The support bar SB may include a first sub support bar SB1 extending in the second direction DR2, and a second sub support bar SB2 extending in the second direction DR2 from each of both sides of the first sub support bar SB1, which are opposite to each other in the second direction DR2. The second sub support bar SB2 may have a smaller thickness than the first sub support bar SB1. The thickness may be defined as a value determined in the third direction DR3. The front surface of the first sub support bar SB1 and the front surface of the second sub support bar SB2 may be defined as the same surface.

The second extension portion EX2 and the third extension portion EX3 may extend onto the rear surface of the support bar SB. For example, the second extension portion EX2 and the third extension portion EX3 may extend onto the rear surface of the second sub support bar SB2.

The first extension portion EX1 may be disposed further to the outside than the second sub support bar SB2 in the second direction DR2 and may thus be adjacent to an end of the second sub support bar SB2. A portion of the first extension portion EX1 between the second extension portion EX2 and an upper end of the first extension portion EX1 may contact the end of the second sub support bar SB2.

The second sub support bar SB2 may be disposed on the second extension portion EX2. The second sub support bar SB2 may contact an upper surface of the second extension portion EX2.

The second sub support bar SB2 may be connected to the first extension portion EX1 and the second extension portion EX2 through the welding process described above. The second sub support bar SB2 may be connected to a portion of the first extension portion EX1 between the second extension portion EX2 and the upper end of the first extension portion EX1. The second sub support bar SB2 may be connected to an upper surface of the second extension portion EX2.

Figure 11:
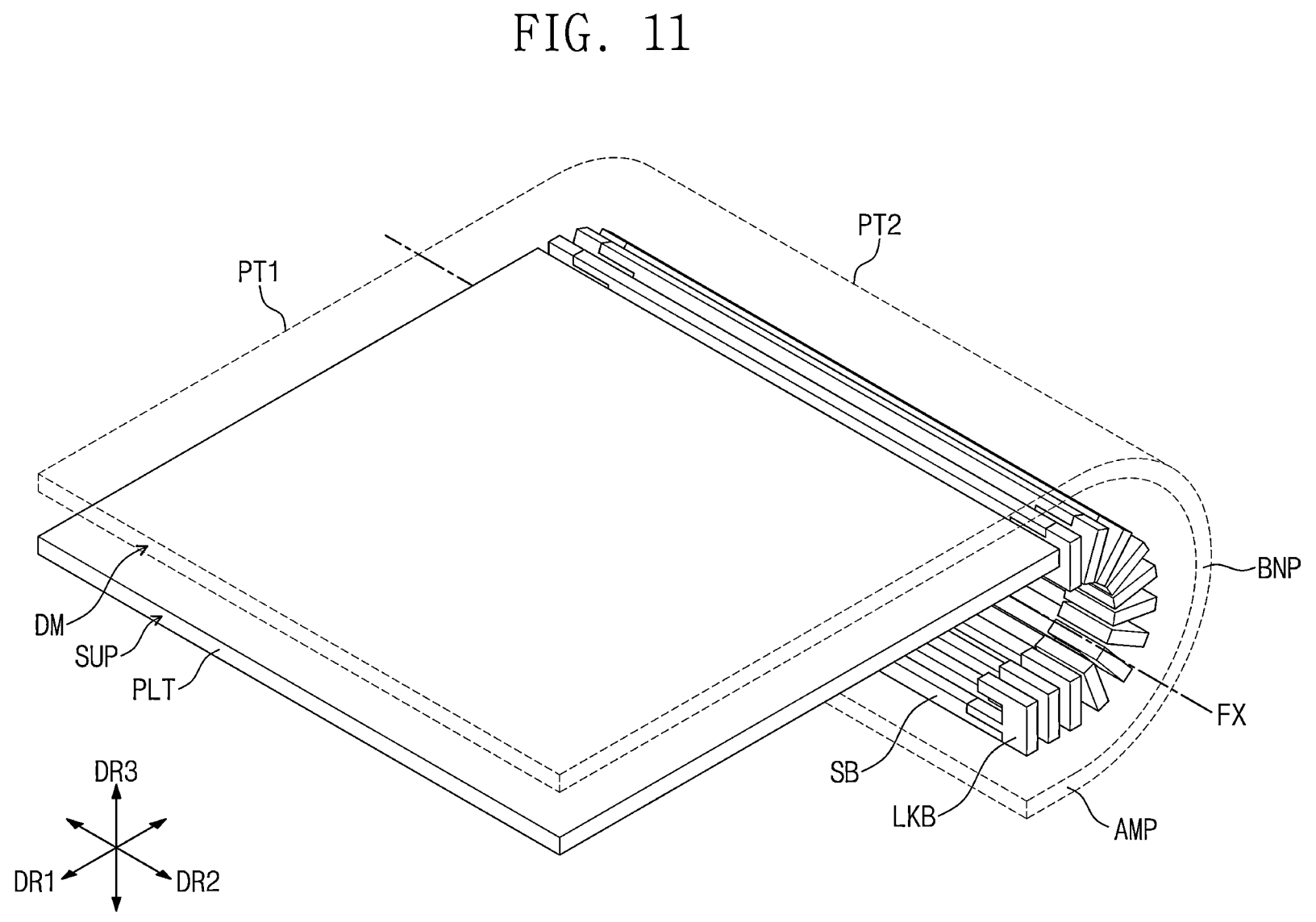

FIG. 11 is a view showing a folded state of a display module shown in FIG. 9.

Referring to FIGS. 9 and 11, the second portion PT2 of the display module DM may be folded with respect to a folding axis FX extending in the second direction DR2. The display module DM may be folded as shown in FIG. 4.

The support bars SB and link bars LKB attached to the second portion PT2 may be arranged along the folded shape of the second portion PT2. Among the support bars SB and link bars LKB, the support bars SB and link bars LKB attached to a bending portion BNP defined as the folded portion of the second portion PT2 may be arranged in a curved shape.

The display module DM and the support portion SUP may be folded as shown in FIG. 11 and accommodated in the case CS shown in FIGS. 1 and 2.

Figure 12:
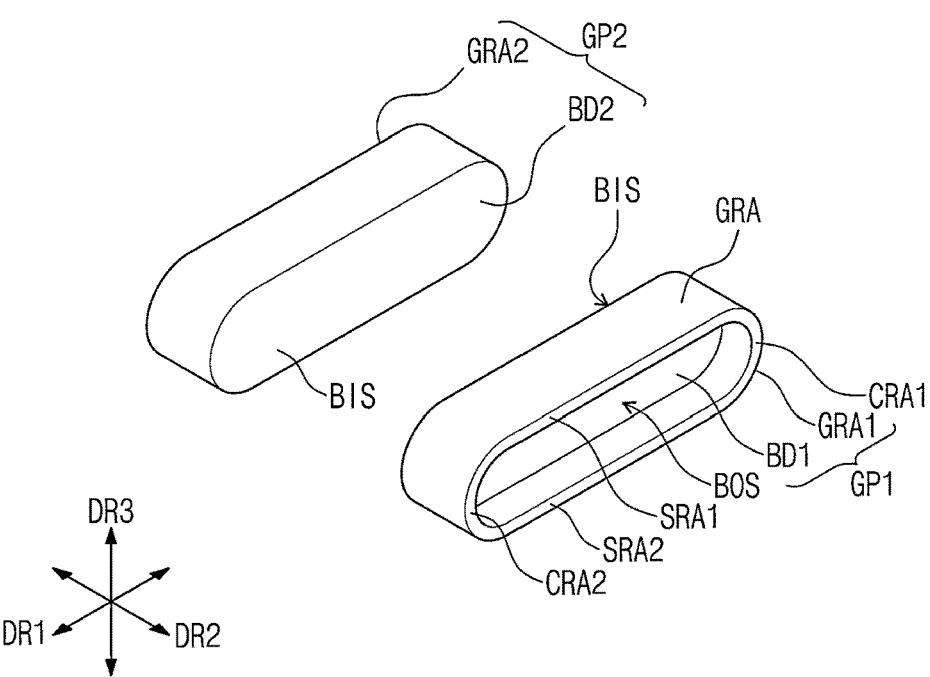
FIG. 12 is a perspective view of first and second guide portions coupled to the link bars shown in FIGS. 9, 10, and 11.

FIG. 12 is a perspective view of first and second guide portions coupled to the link bars shown in FIGS. 9, 10, and 11.

Referring to FIG. 12, the display device DD shown in FIG. 1 may include a first guide portion GP1 and a second guide portion GP2 spaced apart in the second direction DR2. The first guide portion GP1 and the second guide portion GP2 may be symmetrical in the second direction DR2. The first and second guide portions GP1 and GP2 may be accommodated in the case CS, and this configuration will be described in detail below.

The first guide portion GP1 may include a first body portion BD1 and a first guide rail GRA1 protruding from the first body portion BD1. The second guide portion GP2 may include a second body portion BD2 and a second guide rail GRA2 protruding from the second body portion BD2.

The first body portion BD1 and the second body portion BD2 may be spaced apart in the second direction DR2. A side surface of the first body portion BD1 and a side surface of the second body portion BD2, which face each other, may be defined as inner surfaces BIS. The side surface of the first body portion BD1 and the side surface of the second body portion BD2, which are opposite to the inner surfaces BIS, may be defined as outer surfaces BOS.

The first guide rail GRA1 may protrude in the second direction DR2 from the outer surface BOS of the first body BD1. Although the outer surface BOS of the second body portion BD2 is not shown in an observation position of the perspective view, the second guide rail GRA2 may also protrude in the second direction DR2 from the outer surface BOS of the second body BD2. The first guide rail GRA1 and the second guide rail GRA2 may protrude in opposite directions.

The first guide rail GRA1 may protrude from an edge of the first body portion BD1. The second guide rail GRA2 may protrude from an edge of the second body portion BD2. The first and second guide rails GRA1 and GRA2 may each have a closed loop shape when viewed in the second direction DR2. At least a portion of each of the first and second guide rails GRA1 and GRA2 may have a curved shape.

The first and second guide rails GRA1 and GRA2 may each include a first sub rail SRA1, a second sub rail SRA2, a first curved rail CRA1, and a second curved rail CRA2. A closed loop rail may be defined by the first sub rail SRA1, the second sub rail SRA2, the first curved rail CRA1, and the second curved rail CRA2.

The first sub rail SRA1 may extend in the first direction DR1. The second sub rail SRA2 may be disposed below the first sub rail SRA1 and may extend in the first direction DR1. That is, the second sub rail SRA2 may extend parallel to the first sub rail SRA1.

The first curved rail CRA1 may extend from one end of the first sub rail SRA1 to one end of the second sub rail SRA2 and may have a curved shape. The first curved rail CRA1 may have a curved shape bent toward the outside.

The second curved rail CRA2 may extend from the other end of the first sub rail SRA1 to the other end of the second sub rail SRA2 and have a curved shape. The second curved rail CRA2 may have a curved shape bent toward the outside. The second curved rail CRA2 and the first curved rail CRA1 may be symmetrical.

Figure 13:
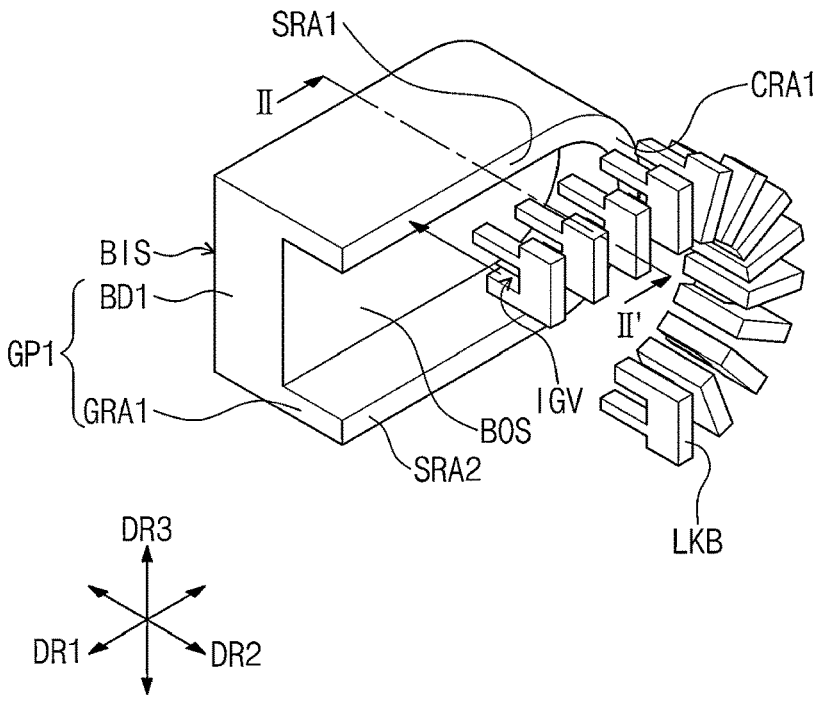
FIG. 13 is a view showing the first guide portion shown in FIG. 12 and link bars coupled to the first guide portion.

FIG. 13 is a view showing the first guide portion shown in FIG. 12 and link bars coupled to the first guide portion.

As an example, FIG. 13 shows a portion of the first sub rail SRA1, a portion of the second sub rail SRA2, and a first curved rail CRA1 by cutting the center of the first guide portion GP1.

Referring to FIGS. 11, 12, and 13, the link bars LKB may be coupled to the first guide portion GP1. The link bars LKB coupled to the first guide portion GP1 may be link bars LKB connected to sides of the support bars SB.

The binding grooves IGV of the link bars LKB may be defined toward the first guide rail GRA1. The first guide rail GRA1 may be inserted into the binding grooves IGV of the link bars LKB, and the link bars LKB may thus be coupled to the first guide rail GRA1. The link bars LKB may move along the first guide rail GRA1.

The link bars LKB may be coupled to the first sub rail SRA1, the first curved rail CRA1, and the second sub rail SRA2, and may thus move along the first sub rail SRA1, the first curved rail CRA1, and the second sub rail SRA2.

Although not shown, the binding grooves IGV of the link bars LKB connected to second sides of the support bars SB may also be defined toward the second guide rail GRA2, and the second guide rail GRA2 may be inserted into the binding grooves IGV of the link bars LKB connected to the second sides of the support bars SB. Accordingly, the link bars LKB may be coupled to the second guide rail GRA2 and may thus move along the second guide rail GRA2.

The link bars LKB connected to the second sides of the support bars SB may also be coupled to the first sub rail SRA1, the first curved rail CRA1, and the second sub rail SRA2 of the second guide rail GRA2, and may thus move along the first sub rail SRA1, the first curved rail CRA1, and the second sub rail SRA2 of the second guide rail GRA2.

Figure 14:
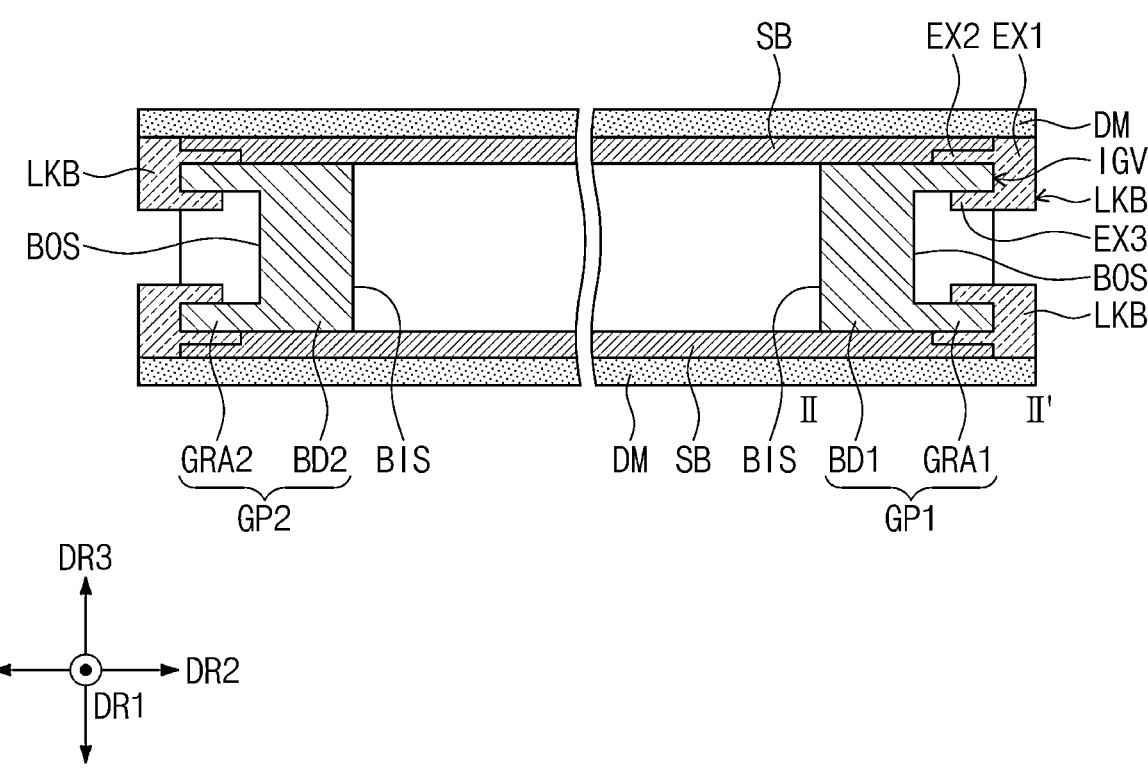
FIG. 14 is a cross-sectional view of FIG. 11.

FIG. 14 is a cross-sectional view of FIG. 11.

FIG. 14 shows a cross section of the second guide portion GP2 as well as a cross section of the first guide portion GP1, which is taken along line II-II' of FIG. 13. In addition, in FIG. 14, the support bars SB, the link bars LKB, and the display module DM are shown along with the first and second guide portions GP1 and GP2.

Referring to FIG. 14, the first and second guide portions GP1 and GP2 may be disposed further to the inside than the link bars LKB on rear surfaces of the support bars SB and may thus be coupled to the link bars LKB. Specifically, the first and second guide rails GRA1 and GRA2 may be disposed further to the inside than the link bars LKB on rear surfaces of the support bars SB, and may thus be coupled to the link bars LKB.

The first guide rail GRA1 may be adjacent to first sides of the support bars SB. The second guide rail GRA2 may be adjacent to second sides of the support bars SB in the second direction DR2. The binding grooves IGV defined in the link bars LKB may face the first and second guide rails GRA1 and GRA2, and the first and second guide rails GRA1 and GRA2 may be inserted into the binding grooves IGV. The second and third extension portions EX2 and EX3 of the link bars LKB may extend toward the first and second guide rails GRA1 and GRA2 (i.e., extend in the second direction DR2).

The first body portion BD1 and the second body portion BD2 may be disposed on the rear surfaces of the support bars SB. The first body portion BD1 and the second body portion BD2 may be disposed further to the inside than the link bars LKB on the rear surfaces of the support bars SB. The first guide rail GRA1 may protrude from the outer surface BOS of the first body portion BD1 toward sides of the support bars SB. The second guide rail GRA2 may protrude from the outer surface BOS of the second body portion BD2 toward the second sides of the support bars SB.

The support bars SB may be disposed on the first and second guide portions GP1 and GP2. Portions of the support bars SB adjacent to opposite sides of the support bars SB may be disposed on the first and second guide portions GP1 and GP2. The first and second guide portions GP1 and GP2 may serve to support the support bars SB.

The display module DM may be disposed on the support bars SB and link bars LKB. The support bars SB may support the display module DM, and the first and second guide portions GP1 and GP2 may additionally support the support bars SB and the display module DM.

On the display module DM, an external impact may be applied toward portions of the display module DM adjacent to both sides of the display module DM, which are opposite to each other in the second direction DR2. In an embodiment of the invention, the first and second guide portions GP1 and GP2 and the support bars SB may double-support the portions of the display module DM adjacent to the opposite sides of the display module DM, and accordingly, the display module DM may have improved impact resistance against external impact.

Figure 15:
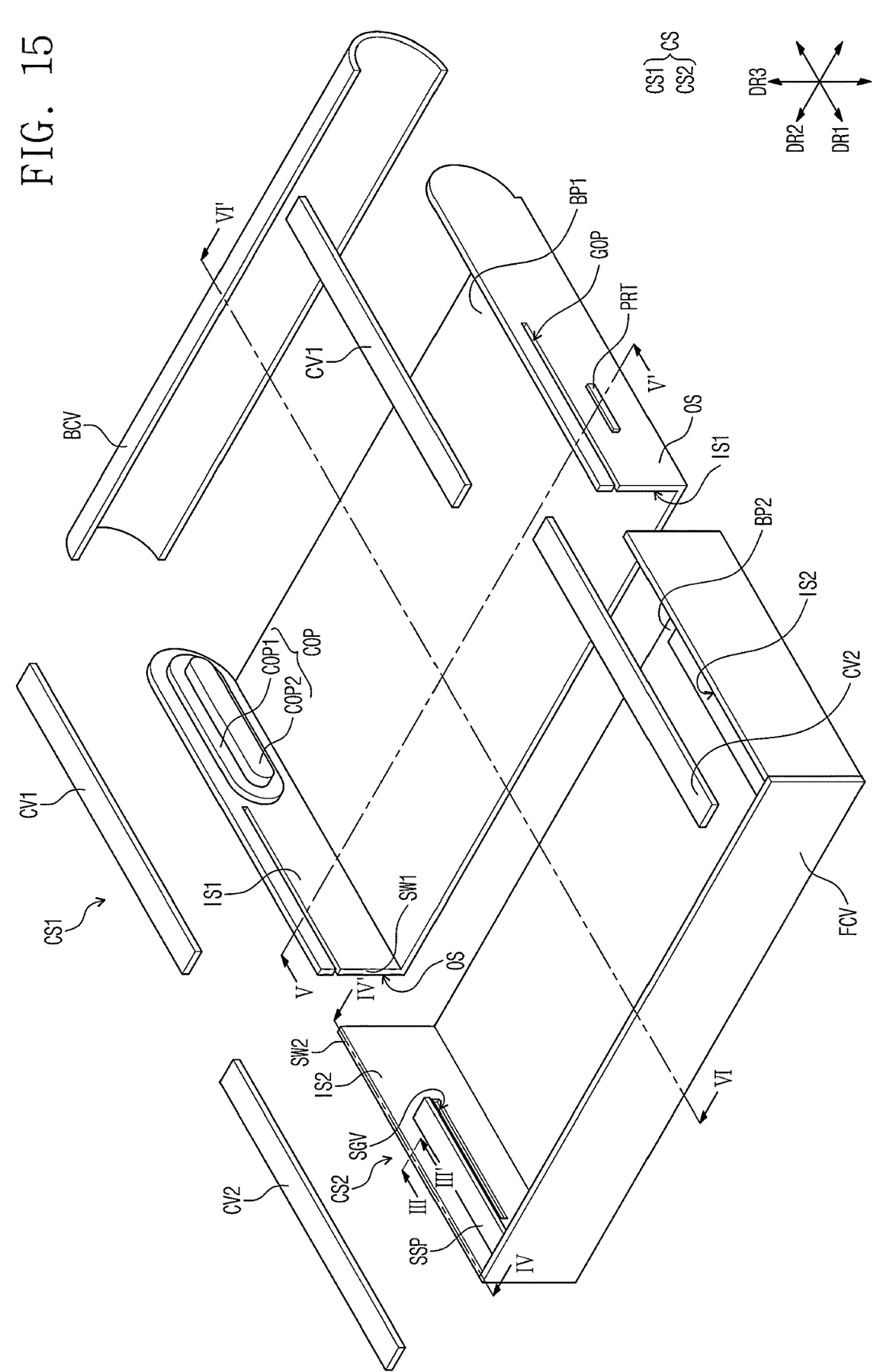
FIG. 15 is an exploded perspective view of a case shown in FIG. 1.

FIG. 15 is an exploded perspective view of a case shown in FIG. 1.

Referring to FIG. 15, the case CS may include a first case CS1 and a second case CS2 disposed in the first direction DR1. The first case CS1 and the second case CS2 may be coupled to each other in the first direction DR1. The first case CS1 may include a first bottom portion BP1, a plurality of first sidewall portions SW1, a plurality of first cover portions CV1, a rear portion BCV, and a plurality of protrusions PRT.

The first bottom portion BP1 may have a plane defined by the first and second directions DR1 and DR2. The first sidewall portions SW1 may extend in the third direction DR3 (e.g., an upward direction) from both sides of the first bottom portion BP1, which are opposite to each other in the second direction DR2. The first sidewall portions SW1 may have a plane defined by the first and third directions DR1 and DR3. The first sidewall portions SW1 may extend longer in the first direction DR1 than in the third direction DR3.

One side of both sides of each of the first sidewall portions SW1, which are opposite to each other in the first direction DR1, may have a curved shape convex outward. The other side of both sides of each of the first sidewall portions SW1, which are opposite to each other in the first direction DR1, may have a straight line shape extending in the third direction DR3.

The first cover portions CV1 may be disposed on the first sidewall portions SW1. The first cover portions CV1 may be connected to upper surfaces of the first sidewall portions SW1. The first cover portions CV1 may have a plane defined by the first and second directions DR1 and DR2. The first cover portions CV1 may extend longer in the first direction DR1 than in the second direction DR2.

The rear surface portion BCV may be disposed on one side of both sides of the first bottom portion BP1, which are opposite to each other in the first direction DR1, and one side of both sides of each of the first sidewall portions SW1, which are opposite to each other in the first direction DR1. One side of each of the first sidewall portions SW1 may be adjacent to one side of the first bottom portion BP1. The rear portion BCV may be connected to one side of the first bottom portion BP1 and one side of each of the first sidewall portions SW1.

The rear surface portion BCV may have a shape convex outward to correspond to the curved shape of one side of each of the first sidewall portions SW1. For example, when viewed in the second direction DR2, an outer surface of the rear surface portion BCV facing the outside may have a curved shape convex outward.

Surfaces of the first sidewall portions SW1, which face each other in the second direction DR2 may be defined as first inner surfaces IS1. Surfaces of the first sidewall portions SW1, which are opposite to the first inner surfaces IS1 may be defined as outer surfaces OS. The first inner surfaces IS1 may define inner surfaces of the case CS, which face each other in the second direction DR2. Specifically, the first inner surfaces IS1 may define inner surfaces of the first case CS1, which face each other in the second direction DR2.

The protrusions PRT may each be disposed on the outer surfaces OS. Although one protrusion PRT is shown in the observation position of the perspective view, two protrusions PRT may each be substantially disposed on the outer surfaces OS. The protrusions PRT may extend in the first direction DR1. The protrusions PRT may protrude from the outer surfaces OS.

The case CS may further include a plurality of connecting portions COP disposed in the first case CS1. The connecting portions COP may each be disposed on the first inner surfaces IS1. Although one connecting portion COP is shown in the observation position of the perspective view, two connecting portions COP may each be substantially disposed on the first inner surfaces IS1. The connecting portions COP may be adjacent to the rear surface BCV. The connecting portions COP may be connected to the first inner surfaces IS1.

The connecting portions COP may each include a first connecting portion COP1 disposed on a corresponding first inner surface IS1 among the first inner surfaces IS1, and a second connecting portion COP2 protruding from the first connecting portion COP1 in the second direction DR2. When viewed in the second direction DR2, the second connecting portion COP2 may have a smaller area than the first connecting portion COP1 and may be disposed within an edge of the first connecting portion COP1.

The second case CS2 may include a second bottom portion BP2, a front portion FCV, a plurality of second sidewall portions SW2, a plurality of second cover portions CV2, and a plurality of sub support portions SSP. The second bottom portion BP2 may have a plane defined by the first and second directions DR1 and DR2.

The second sidewall portions SW2 may extend upward from both sides of the second bottom portion BP2, which are opposite to each other in the second direction DR2. The second sidewall portions SW2 may have a plane defined by the first and third directions DR1 and DR3. The second sidewall portions SW2 may extend longer in the first direction DR1 than in the third direction DR3.

The second bottom portion BP2 may be disposed below the first bottom portion BP1. The second sidewall portions SW2 may be disposed further to the outside than the first sidewall portions SW1. That is, the second sidewall portions SW2 may be disposed on the outer surfaces OS of the first sidewall portions SW1.

The front portion FCV may be disposed to face the rear portion BCV. The front portion FCV may be disposed on one side of both sides of the second bottom portion BP2, which are opposite to each other in the first direction DR1. One side of the second bottom portion BP2 may be defined as a portion of the second bottom portion BP2, which is spaced farthest from the rear portion BCV. The front portion FCV may be connected to one side of the second bottom portion BP2 and may thus extend in the third direction DR3 (e.g., an upward direction).

The front portion FCV may have a plane defined by the second and third directions DR2 and DR3. The front portion FCV may extend longer in the second direction DR2 than in the third direction DR3.

Surfaces of the second sidewall portions SW2, which face each other in the second direction DR2 may be defined as second inner surfaces IS2. Sliding grooves SGV may be defined on the second inner surfaces IS2. The sliding grooves SGV may extend in the first direction DR1. Although one sliding groove SGV is shown in the observation position of the perspective view, two sliding grooves SGV may each be substantially defined on the second inner surfaces IS2.

When the second case CS2 is coupled to the first case CS1 and the second sidewall portions SW2 are thus disposed on the outer surfaces OS of the first sidewall portions SW1, the protrusions PRT may be inserted into the sliding grooves SGV. This configuration will be described in detail later.

The second cover portions CV2 may be disposed on the second sidewall portions SW2. The second cover portions CV2 may be connected to upper surfaces of the second sidewall portions SW2. The second cover portions CV2 may have a plane defined by the first and second directions DR1 and DR2. The second cover portions CV2 may extend longer in the first direction DR1 than in the second direction DR2. When the first case CS1 and the second case CS2 are coupled to each other, the second cover portions CV2 may each be disposed on the first cover portions CV1.

The sub support portions SSP may each be disposed on the second inner surfaces IS2. The sub support portions SSP may have a plane defined by the first and second directions DR1 and DR2. The sub support portions SSP may extend longer in the first direction DR1 than in the second direction DR2. The sub support portions SSP may be adjacent to the front portion FCV. The sub support portions SSP may each be connected to the second inner surfaces IS2. The sub support portions SSP may be disposed above the sliding grooves SGV.

Guide openings GOP may be defined in the first sidewall portions SW1. The guide openings GOP may extend from the other side of the first sidewall portions SW1 in the first direction DR1 and may thus be defined on the first sidewall portions SW1. The guide openings GOP may be adjacent to the connecting portions COP. When the first case CS1 and the second case CS2 are coupled to each other, the sub support portions SSP may be disposed in the guide openings GOP.

Figure 16:
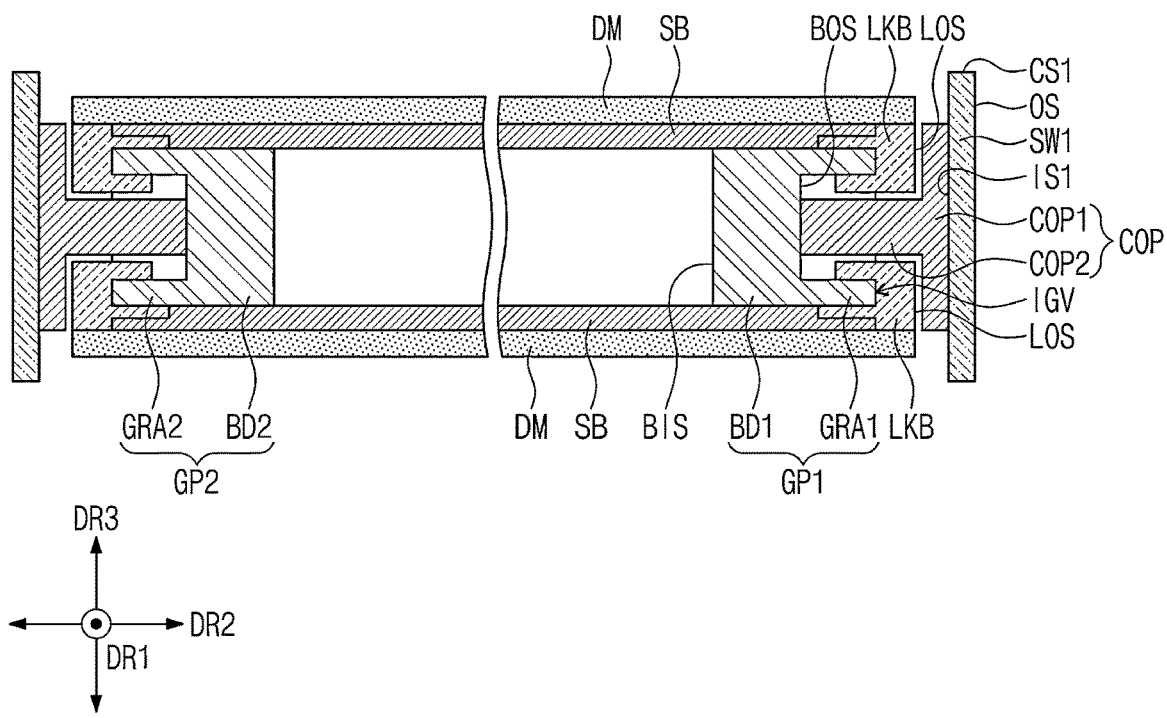
FIG. 16 is a view showing a state in which the connecting portions shown in FIG. 15 are connected to a case and first and second guide portions.

FIG. 16 is a view showing a state in which the connecting portions shown in FIG. 15 are connected to the case and the first and second guide portions. As an example, FIG. 16 is shown as a cross-section corresponding to FIG. 14.

Referring to FIG. 16, the connecting portions COP may bond the first and second guide portions GP1 and GP2 each to the first case CS1. The connecting portions COP may each be connected to the first inner surfaces IS1 of the first case CS1. The connecting portions COP may each be connected to the first and second guide portions GP1 and GP2. The connecting portions COP may be spaced apart from the first and second guide rails GRA1 and GRA2, and may each be connected to the first body portion BD1 and the second body portion BD2.

The first connecting portions COP1 may each be connected to the first inner surfaces IS1. The second connecting portions COP2 may face each other in the second direction DR2 and protrude toward each other. The second connecting portions COP2 may be spaced apart from the first and second guide rails GRA1 and GRA2, and may each be connected to the first and second body portions BD1 and BD2. The second connecting portions COP2 may each be connected to the outer surfaces BOS of the first and second body portions BD1 and BD2.

The connecting portions COP may be connected to the first and second guide portions GP1 and GP2 and the first case CS1 in various ways. For example, the connecting portions COP may be connected (i.e., fixed) to the first and second guide portions GP1 and GP2 and the first case CS1 by screws or adhesives.

The second connecting portions COP2 may each be disposed within the first and second guide rails GRA1 and GRA2 having a closed loop shape. In addition, the second connecting portions COP2 may be disposed between the link bars LKB. In the cross section, the second connecting portions COP2 may extend in the second direction DR2 from the first connecting portions COP1.

The connecting portions COP connected to the first and second guide portions CP1 and CP2 may be disposed on the outer surfaces LOS of the link bars LKB to cover the outer surfaces LOS of the link bars LKB. The outer surfaces LOS of the link bars LKB may be defined as side surfaces that do not face the first and second guide rails GRA1 and GRA2 and face the first sidewall portions SW1.

In the cross section, the first connecting portions COP1 may extend in the third direction DR3 and may thus be disposed on the outer surfaces LOS of the link bars LKB. That is, the first connecting portions COP1 may cover the outer surfaces LOS of the link bars LKB.

The link bars LKB may be fixed at opposite sides in the second direction DR2 by the first and second guide portions GP1 and GP2 and the connecting portions COP, and accordingly, the link bars LKB may be fixed more firmly. In this case, even when an external impact is applied to the link bars LKB, the link bars LKB may not be separated from the first and second guide portions GP1 and GP2.

In another comparative embodiment, the first and second guide portions GP1 and GP2 may not be disposed further to the inside than the link bars LKB, but may be disposed further to the outside than the link bars LKB. In this case, the binding grooves IGV are defined to face outward in the link bars LKB, and the first and second guide portions GP1 and GP2 disposed further to the outside than the link bars LKB may be inserted into the binding grooves IGV.

A bezel region may be defined in the display device DD. The bezel region is an image non-display region and may be formed by elements disposed further to the outside than the display module DM when viewed on a plane (i.e., in a plan view). An area in which the first and second guide portions GP1 and GP2 are disposed further to the outside than the link bars LKB may be defined as a bezel region. When the first and second guide portions GP1 and GP2 are disposed further to the outside than the link bars LKB, the bezel region may extend through the first and second guide portions GP1 and GP2.

In an embodiment of the invention, the first and second guide portions GP1 and GP2 may be disposed further to the inside than the link bars LKB. The first and second guide portions GP1 and GP2 are not disposed further to the outside than the link bars LKB, and the bezel region may thus be reduced.

Figure 17:
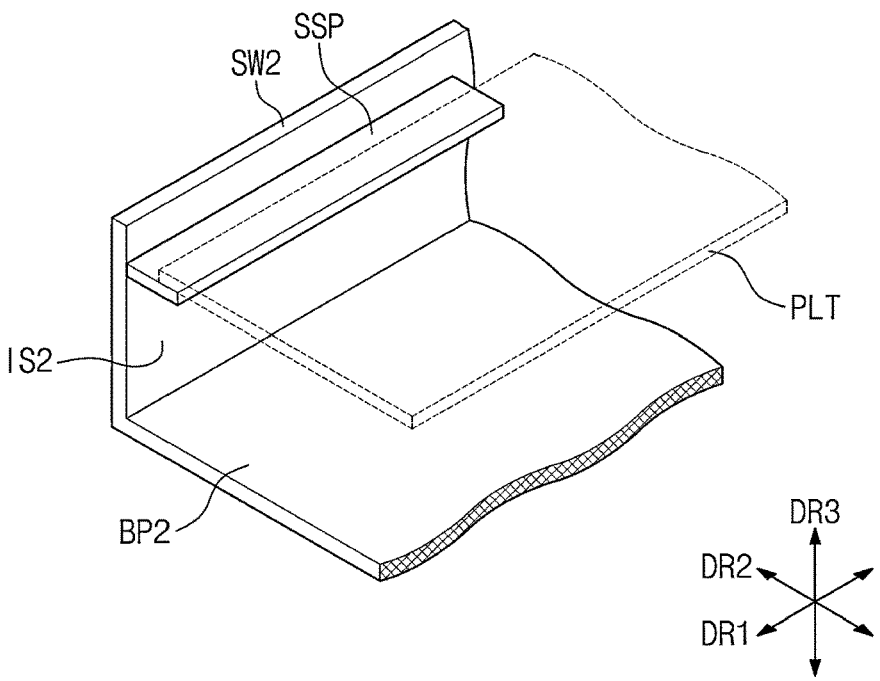
FIG. 17 is a view showing a state in which a support plate shown in FIGS. 9 and 11 is disposed on a sub support portion shown in FIG. 15.

FIG. 17 is a view showing a state in which support plates shown in FIGS. 9 and 11 are disposed on a sub support portion shown in FIG. 15.

As an example, FIG. 17 shows a portion of the second sidewall portion SW2, a portion of the second bottom portion BP2, a portion of the support plate PLT, and the sub support portion SSP, and the support plate PLT is shown in dotted line.

Referring to FIG. 17, the support bars SB may be coupled to the first and second guide portions GP1 and GP2 by the link bars LKB, but the support plate PLT may not be coupled to the first and second guide portions GP1 and GP2. Accordingly, a structure for supporting the support plate PLT is desirable. In an embodiment of the invention, the sub support portion SSP may be disposed below the support plate PLT to support the support plate PLT.

Figure 18:
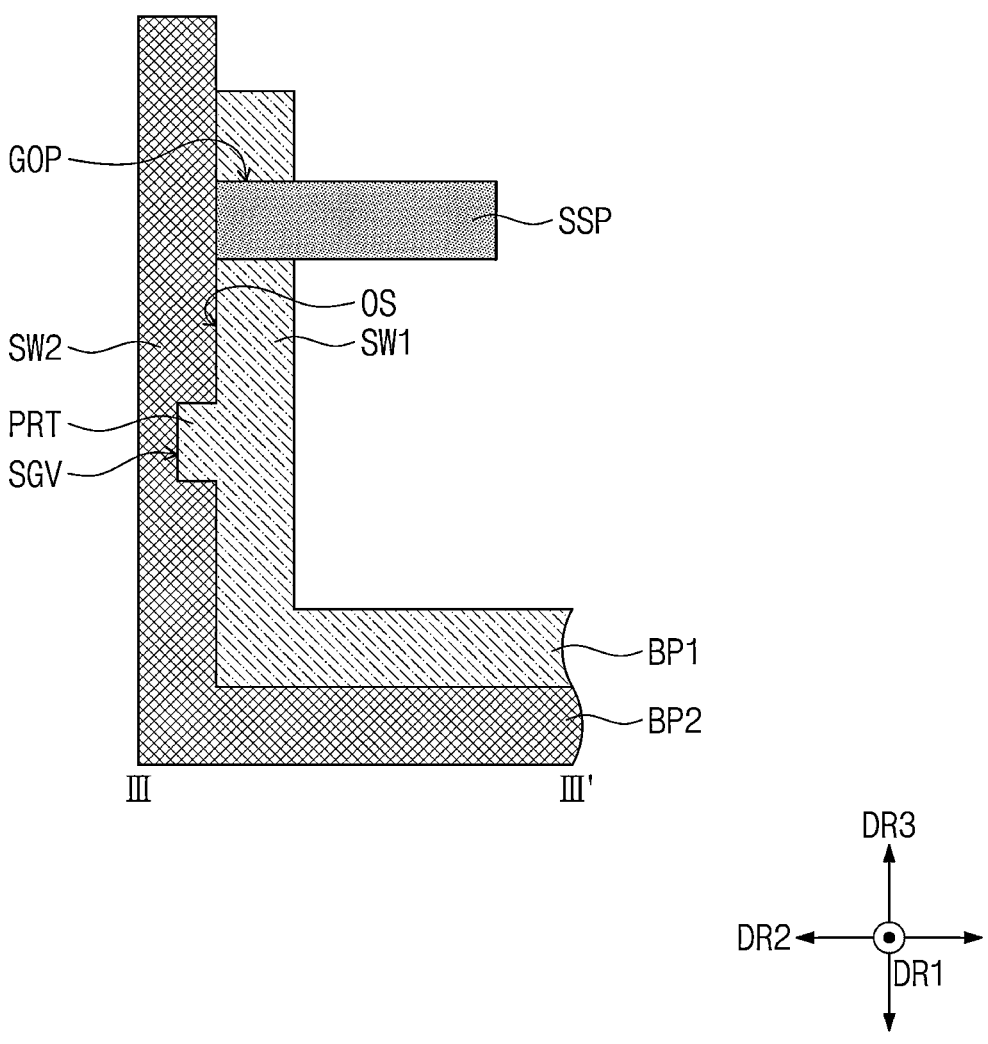
FIG. 18 is a cross-sectional view of line III-III' shown in FIG. 15.
Figure 19A:
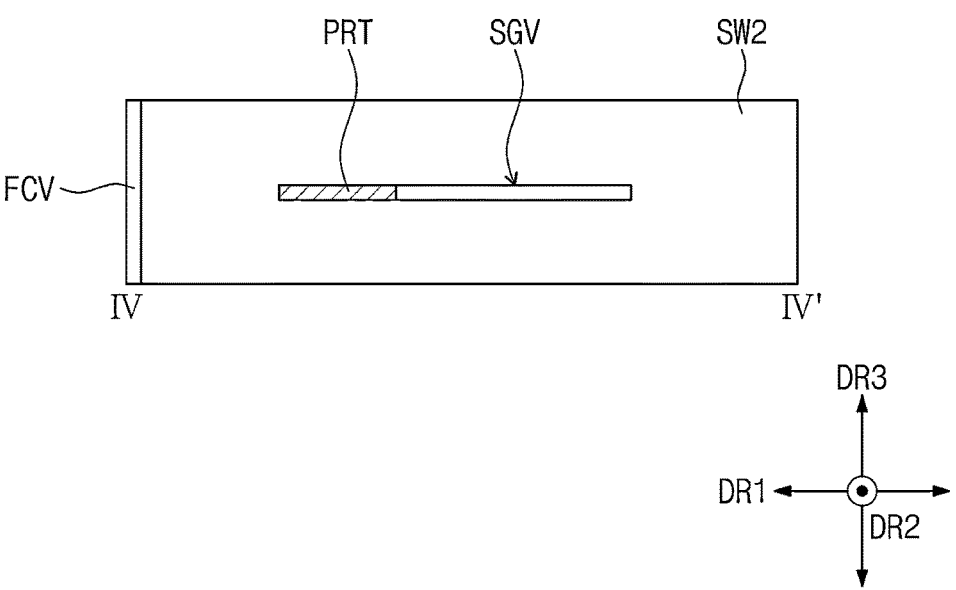
FIGS. 19A and 19B are cross-sectional views of line IV-IV' shown in FIG. 15.
Figure 19B:
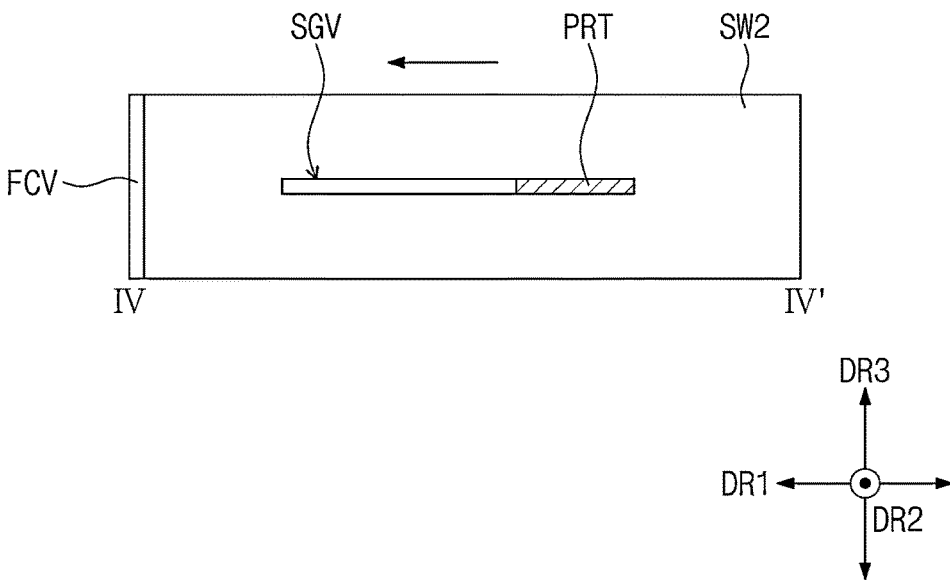

FIG. 18 is a cross-sectional view of line III-III' shown in FIG. 15. FIGS. 19A and 19B are cross-sectional views of line IV-IV' shown in FIG. 15.

For example, in FIG. 18, assuming that the first and second cases CS1 and CS2 are coupled, the first sidewall portion SW1 and the second sidewall portion SW2 are shown together. FIGS. 19A and 19B show a state in which the protrusion PRT is disposed in the sliding groove SGV.

Referring to FIGS. 15 and 18, when the first and second cases CS1 and CS2 are coupled, the second bottom portion BP2 may be disposed below the first bottom portion BP1. The second bottom portion BP2 may contact a lower surface of the first bottom portion BP1. The second sidewall portion SW2 may be disposed outside the first sidewall portion SW1. The second sidewall portion SW2 may be disposed to contact the outer surface OS of the first sidewall portion SW1. The protrusion PRT may protrude from the first sidewall portion SW1.

The protrusion PRT may protrude from the outer surface OS. When the first and second cases CS1 and CS2 are coupled, the protrusion PRT may be disposed in the sliding groove SGV defined in the second sidewall portion SW2.

The sub support portion SSP may be connected to the second sidewall portion SW2. The sub support portion SSP may be disposed in the guide opening GOP defined in the first sidewall portion SW1. When the first and second cases CS1 and CS2 relatively move in the first direction DR1, the sub support portion SSP may move in the first direction DR1 along the guide opening GOP.

Referring to FIGS. 1, 15, 18, and 19A, in the basic mode, the protrusion PRT may be disposed on one side of the sliding groove SGV. One side of the sliding groove SGV may be adjacent to the front portion FCV in the first direction DR1. When the second case CS2 moves toward the first case CS1 to the maximum, the protrusion PRT may be disposed on one side of the sliding groove SGV.

Referring to FIGS. 2, 15, 18, and 19B, in the extended mode, the second case CS2 and the first case CS1 may move in the first direction DR1 to be away from each other. In this case, the protrusion PRT may move in the first direction DR1 along the sliding groove SGV. When the protrusion PRT moves along the sliding groove SGV and is disposed on the other side of the sliding groove SGV, the protrusion PRT may stop moving.

The other side of the sliding groove SGV may be a portion of the sliding groove SGV, which is spaced farthest from the front portion FCV. One side and the other side of the sliding groove SGV may be opposite to each other in the first direction DR1.

When the first case CS1 and the second case CS2 continue to move away from each other, the first case CS1 and the second case CS2 may be separated. However, in an embodiment of the invention, the protrusion PRT moving in the first direction DR1 is disposed on the other side of the sliding groove SGV, and the second case CS2 may thus stop moving. A movement amount of the second case CS2 may be controlled according to the length of the protrusion PRT and the sliding groove SGV in the first direction DR1.

In the basic mode shown in FIG. 1 and the extended mode shown in FIG. 2, the movement amount of the second case CS2 relative to the first case CS1 may be determined according to the protrusion PRT moving along the sliding groove SGV in the first direction DR1.

Figure 20:
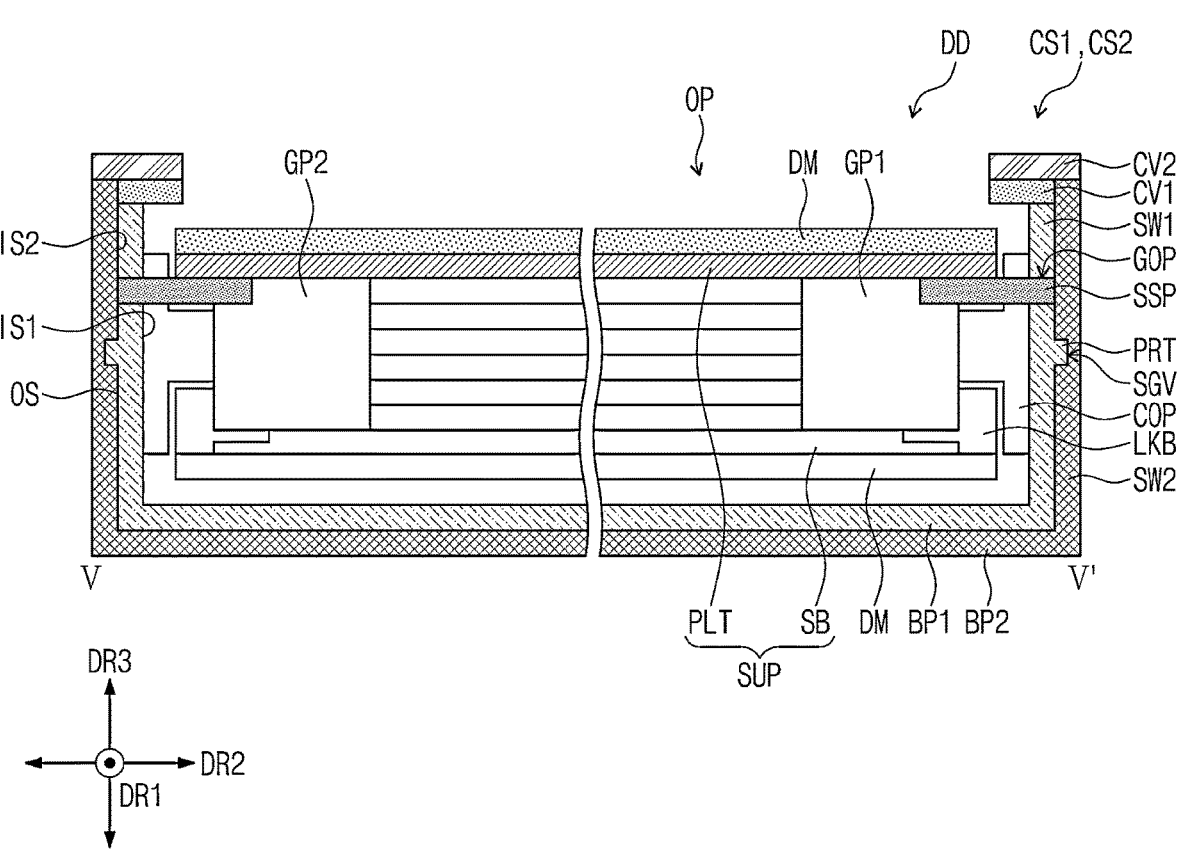
FIG. 20 is a cross-sectional view of line V-V' shown in FIG. 15.

FIG. 20 is a cross-sectional view of line V-V' shown in FIG. 15.

As an example, FIG. 20 shows the support portion SUP and the display module DM accommodated in the first case CS1 together with the first case CS1, and the first case CS1 and the second case CS2 are shown to be coupled.

Referring to FIGS. 15, 16, and 20, the sub support portions SSP connected to the second inner surfaces IS2 may face each other in the second direction DR2. The support plate PLT may be disposed on the sub support portions SSP connected to the second sidewall portions SW2, and the sub support portions SSP may support the support plate PLT. The display module DM may be disposed on the support plate PLT, and the support plate PLT may support the display module DM.

The first cover portions CV1 may be disposed on the first sidewall portions SW1. The first cover portions CV1 may extend in the second direction DR2 on the first sidewall portions SW1. When viewed on a plane, the first cover portions CV1 may overlap the connecting portions COP.

The second cover portions CV2 may be disposed on the second sidewall portions SW2 and the first cover portions CV1. The second cover portions CV2 may extend in the second direction DR2 on the second sidewall portions SW2. When viewed on a plane (i.e., in a plan view), the second cover portions CV2 may overlap the connecting portions COP. The first cover portions CV1 and the second cover portions CV2 cover the connecting portions COP, and the connecting portions COP may thus not be viewed to the outside.

The display module DM may be exposed to the outside through an opening OP defined between the first cover portions CV1 and between the second cover portions CV2.

Figure 21A:
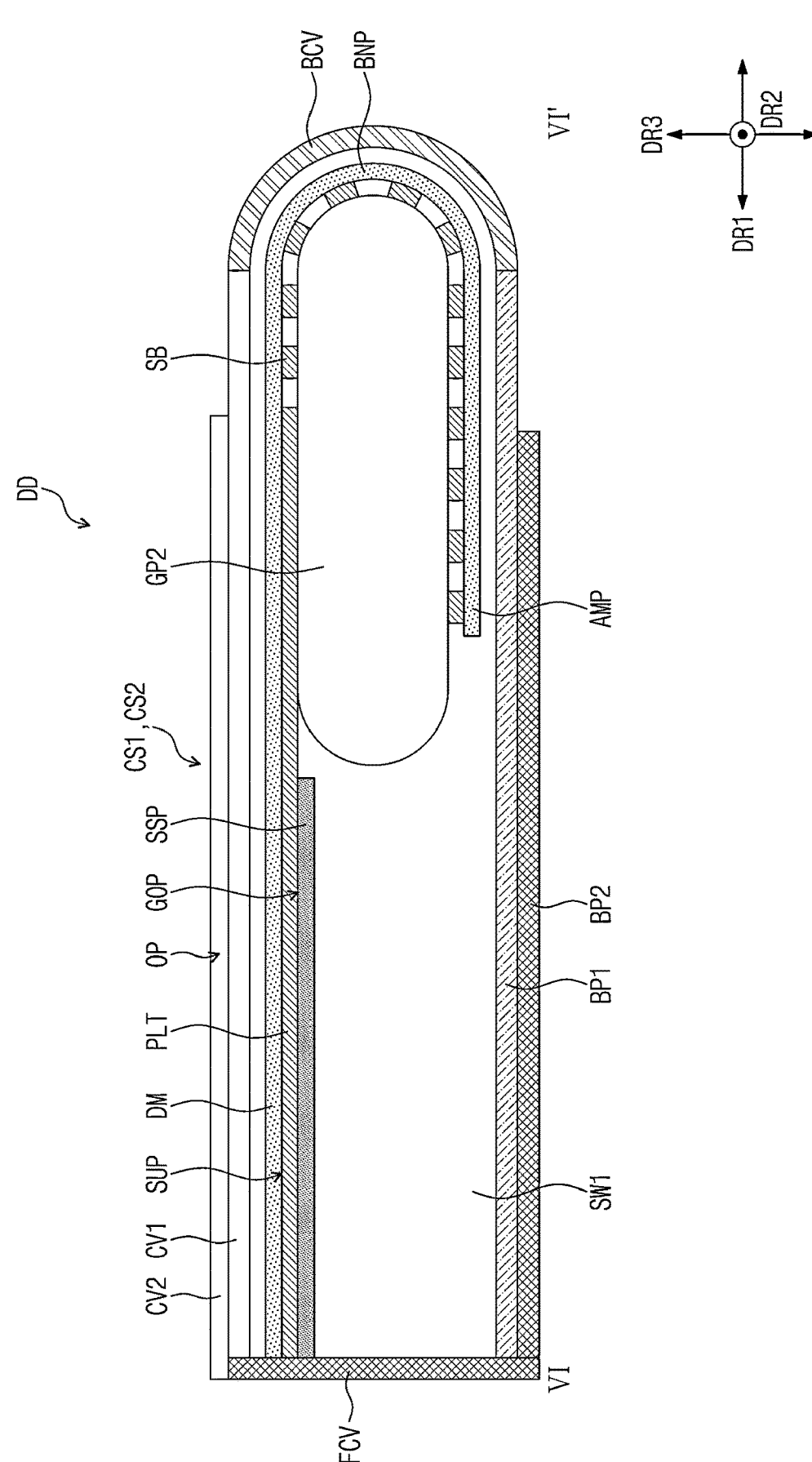
FIG. 21A is a cross-sectional view of line VI-VI' shown in FIG. 15, and is a view showing a basic mode of the display device shown in FIG. 1.
Figure 21B:
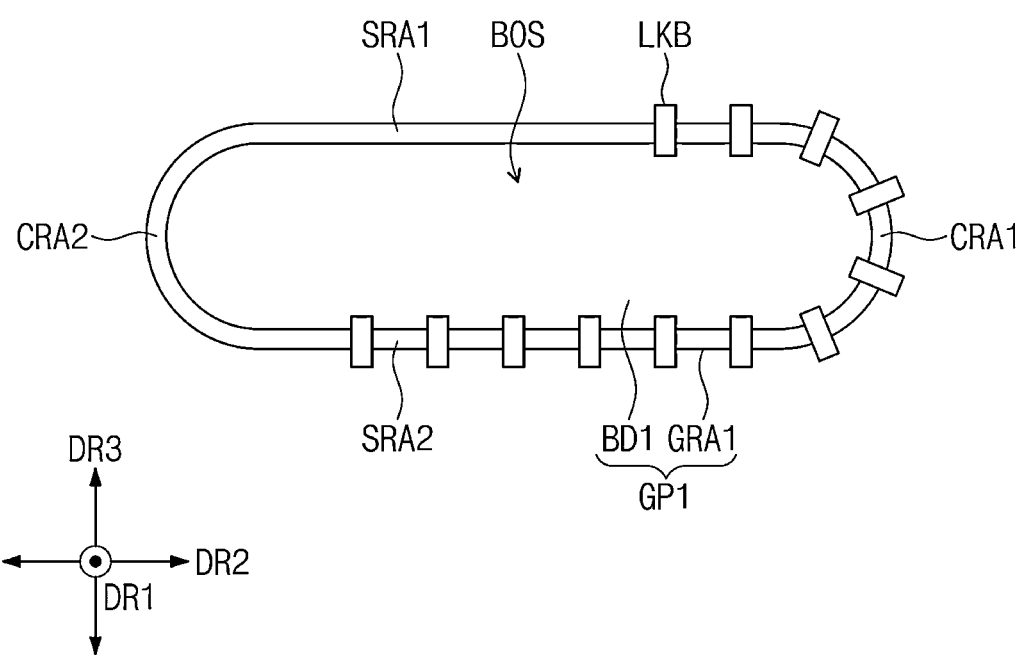
FIG. 21B is a side view of a state in which link bars are coupled to a first guide portion in the basic mode shown in FIG. 21A when viewed from a second direction.
Figure 22A:
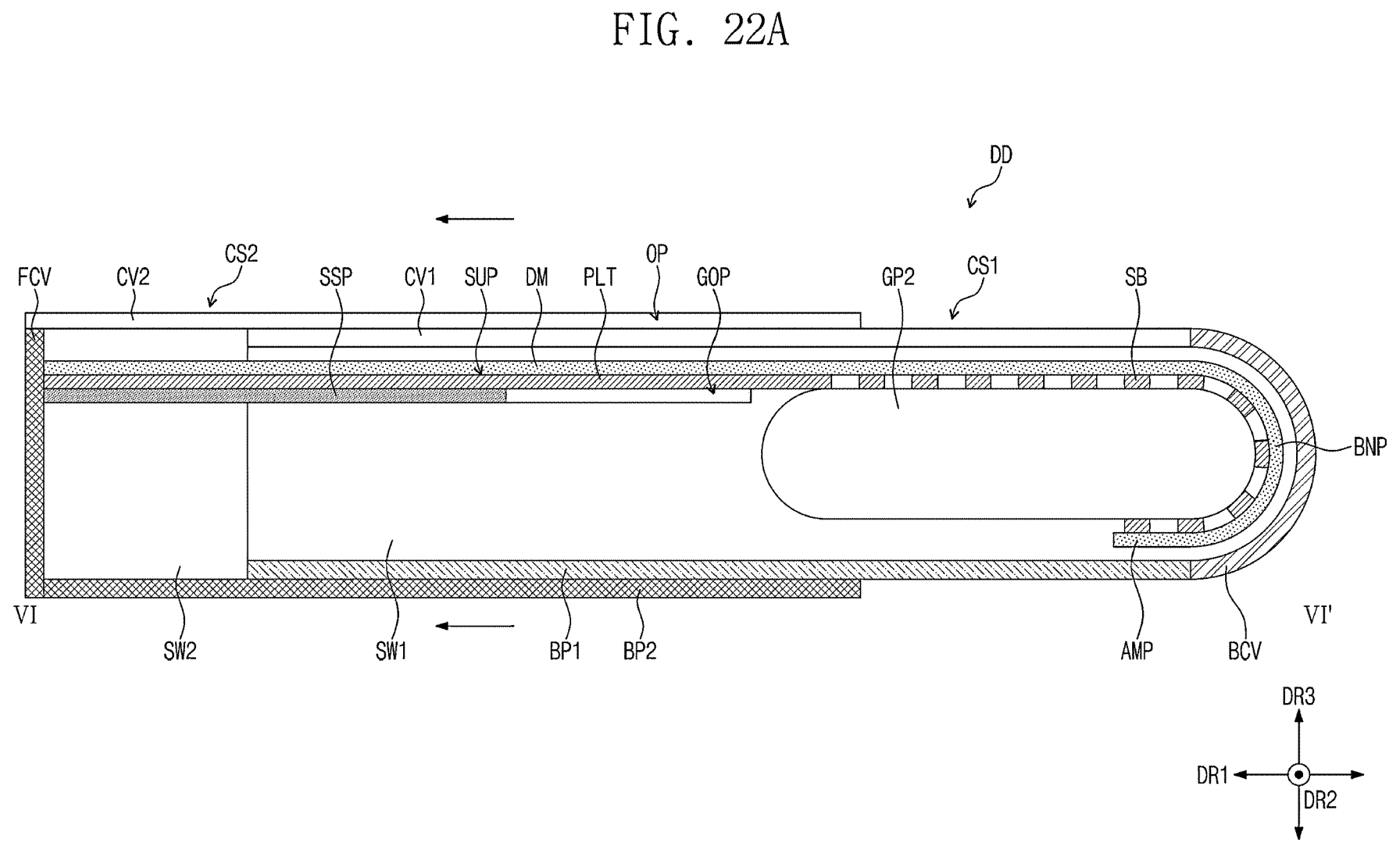
Figure 22B:
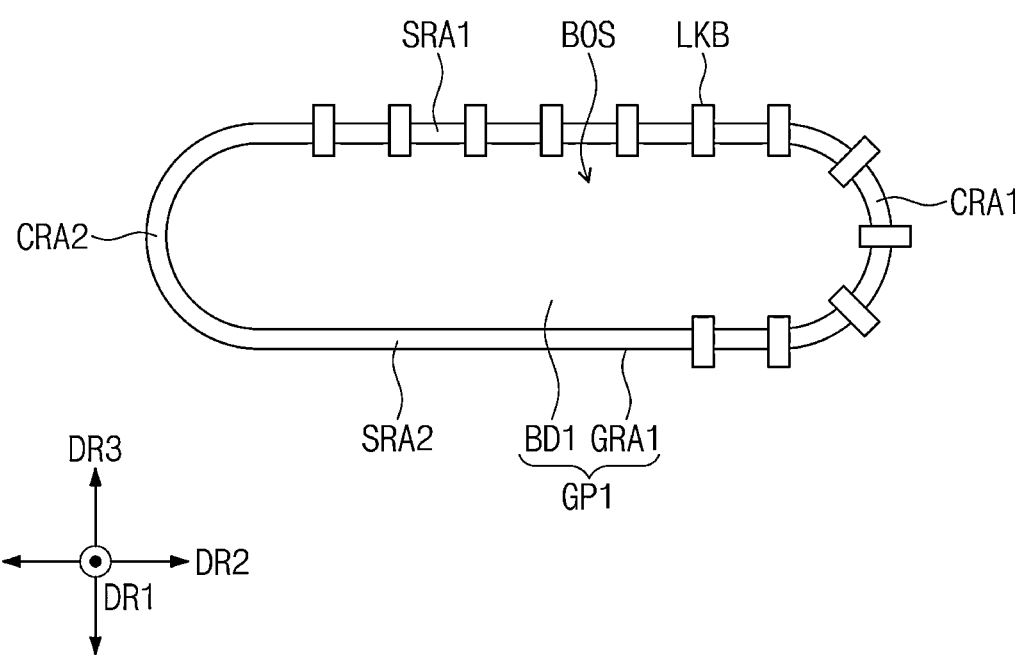
FIG. 22B is a side view of a state in which link bars are coupled to a first guide portion in the extended mode shown in FIG. 22A when viewed from a second direction.

FIG. 21A is a cross-sectional view of line VI-VI' shown in FIG. 15, and is a view showing a basic mode of the display device shown in FIG. 1. FIG. 21B is a side view of a state in which link bars are coupled to a first guide portion in the basic mode shown in FIG. 21A when viewed from a second direction. FIG. 22A is a cross-sectional view of line VI-VI' shown in FIG. 15 and is a view showing an extended mode of the display device shown in FIG. 2. FIG. 22B is a side view of a state in which link bars are coupled to a first guide portion in the extended mode shown in FIG. 22A when viewed from a second direction.

As an example, FIGS. 21A and 22A show the display module DM and the support portion SUP accommodated in the case CS together with the case CS.

In the cross-section, the link bars LKB are not shown in FIGS. 21A and 22A, and the link bars LKB coupled to the first guide rail GRA1 are separately shown in FIGS. 21B and 22B. FIGS. 21B and 22B, the first guide portion GP1 is shown in a state in which the outer surface BOS of the first body portion BD1 is viewed.

Referring to FIGS. 1, 20A, and 20B, the display module DM, the support plate PLT, the support bars SB, the link bars LKB, and the first and second guide portions GP1 and GP2 may be accommodated in the case CS. The display module DM may be folded and accommodated in the case CS. A portion of the display module DM may be exposed to the outside through the opening OP.

The support plate PLT and the support bars SB may support the display module DM. The support bars SB may be arranged along the curved shape of the display module DM. The link bars LKB may also be arranged along the curved shape of the display module DM.

The link bars LKB may be coupled to the first sub rail SRA1, the first curved rail CRA1, and the second sub rail SRA2, but may not be coupled to the second curved rail CRA2. The first curved rail CRA1 may be adjacent to the bending portion BNP of the display module DM and may be bent to have a shape corresponding to the bending portion BNP. In the basic mode, the number of link bars LKB and support bars SB coupled to the first sub rail SRA1 may be less than the number of link bars LKB and support bars SB coupled to the second sub rail SRA2.

The link bars LKB may move along the closed loop portion of each of the first and second guide rails GRA1 and GRA2. That is, the link bars LKB may move along the first sub rail SRA1, the first curved rail CRA1, and the second sub rail SRA2, which are portions of each of the first and second guide rails GRA1 and GRA2. The link bars LKB may not move to the second curved rail CRA2.

The display module DM and the support plate PLT may be accommodated in the first case CS1 and thus be connected to the second case CS2. For example, one side of the display module DM and one side of the support plate PLT spaced farthest from the support bars SB may be connected to the front portion FCV. The display module DM and the support plate PLT may be connected to the front portion FCV and fixed thereto. As the front portion FCV moves, the display module DM and the support plate PLT connected to the front portion FCV may move.

The accommodation portion AMP of the display module DM described above may be disposed adjacent to the second sub rail SRA2. The accommodation portion AMP may be disposed in the first case CS1 and may thus not be exposed to the outside.

In the basic mode, the sub support portion SSP may be disposed within the guide opening GOP. The sub support portion SSP may be adjacent to the second guide portion GP2. Another sub support portion SSP, which is not shown in the cross-sectional view, may be adjacent to the first guide portion GP1.

Referring to FIGS. 2, 22A, and 22B, in the extended mode, the second case CS2 may move away from the first case CS1 in the first direction DR1. Accordingly, the display module DM may extend to the outside.

The link bars LKB move along the first sub rail SRA1, the first curved rail CRA1, and the second sub rail SRA2, and the support bars SB may thus move along with the link bars LKB. As the link bars LKB and support bars SB move, the display module DM may extend to the outside.

In the extended mode, the number of link bars LKB and support bars SB coupled to the first sub rail SRA1 may be greater than the number of link bars LKB and support bars SB coupled to the second sub rail SRA2.

The sub support portion SSP may move in the first direction DR1 relative to the first case CS1. The sub support portion SSP may be disposed within the guide opening GOP, and may move in the first direction DR1 along the guide opening GOP.

An area of the display module DM exposed to the outside extends in the extended mode, and accordingly, an area of the display surface DS exposed to the outside may extend. When changing from the extended mode to the basic mode, the front portion FCV and the first case CS1 may move in the first direction DR1 to come closer to each other. Thus, the basic mode shown in FIG. 21A may be performed.

Figure 23:
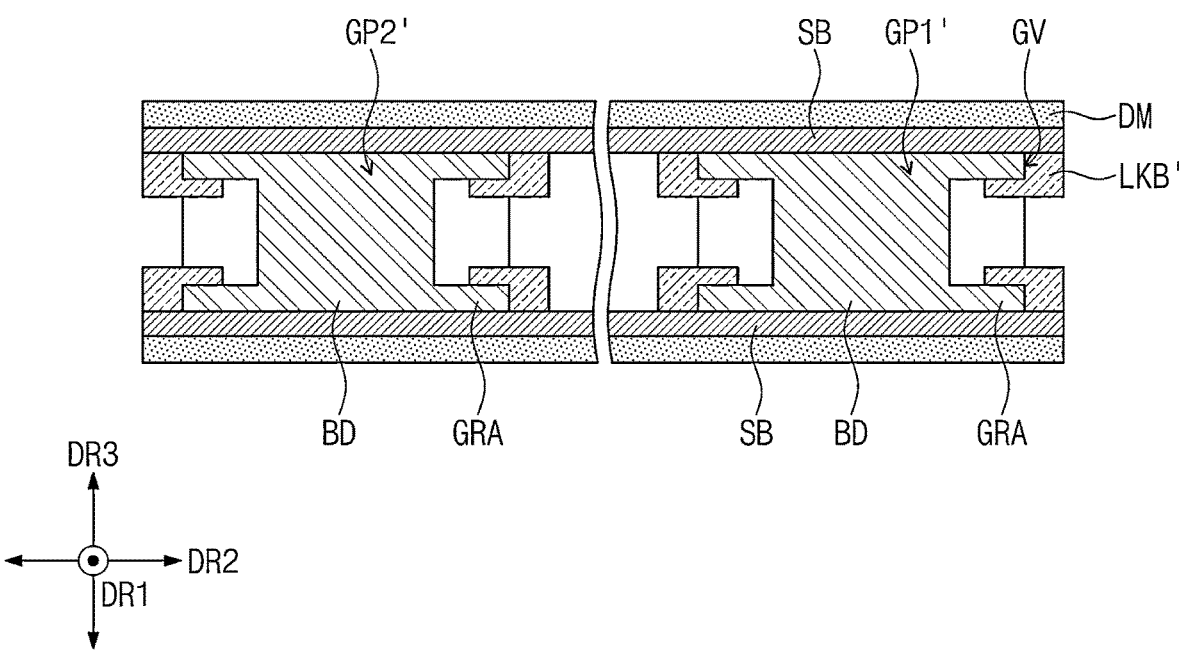
FIGS. 23 to 25 are views showing various embodiments of link bars and guide portions according to an embodiment of the invention.
Figure 24:
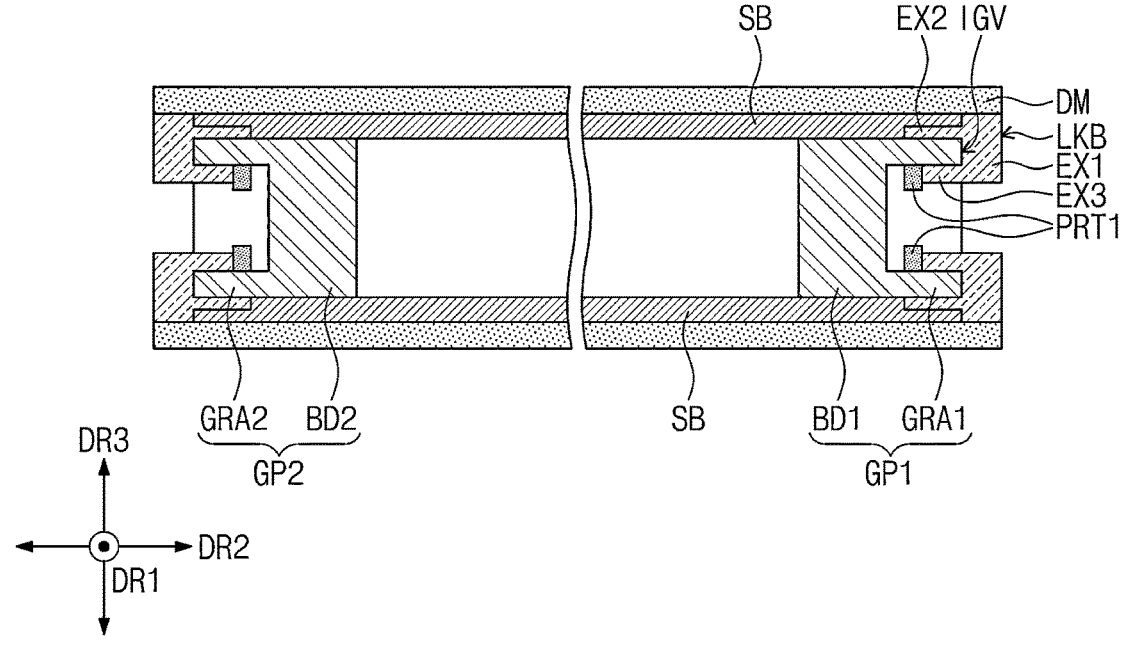
Figure 25:
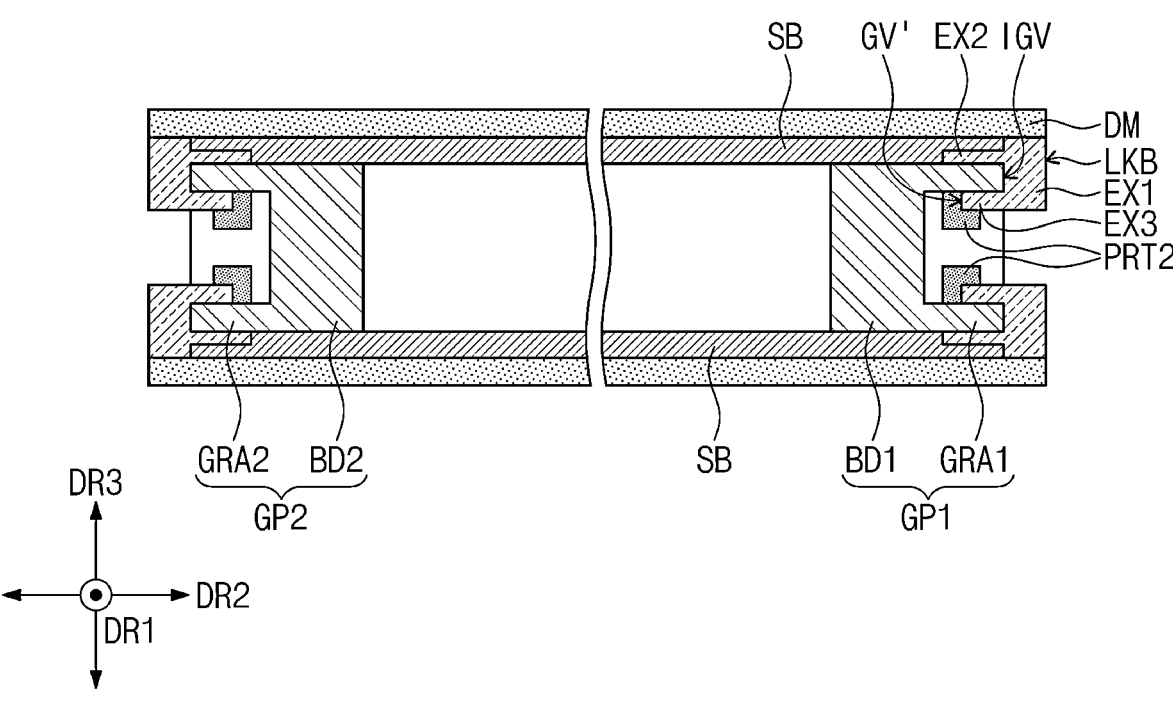

FIGS. 23 to 25 are views showing various embodiments of link bars and guide portions according to an embodiment of the invention.

As an example, FIGS. 23 to 25 are shown in cross-sections corresponding to FIG. 14. Hereinafter, components shown in FIGS. 23 to 25 will be described, focusing on the components different from those shown in FIG. 14.

Referring to FIG. 23, a first guide portion GP1' and a second guide portion GP2' spaced apart in the second direction DR2 may be disposed on the rear surface of the support bars SB. The first and second guide portions GP1' and GP2' each include a body portion BD, and a guide rail GRA protruding from each of both sides of the body portion BD, which are opposite to each other in the second direction DR2.

The link bars LKB' may be connected to rear surfaces of the support bars SB. The link bars LKB' may have an "L" shape. The link bars LKB' may be coupled to the guide rails GRA.

The link bars LKB' coupled to the guide rail GRA protruding from one side of each of the body portions BD and the link bars LKB' coupled to the guide rail GRA protruding from the other side of each of the body portions BD may be symmetrical in the second direction DR2.

The link bars LKB' coupled to the guide rails GRA protruding from one side of each of the body portions BD may have an "L" shape. The link bars LKB' coupled to the guide rails GRA protruding from the other side of each of the body portions BD may have a shape in which the "L" shape is reversed left and right.

The guide rails GRA are inserted into the grooves GV defined between the "L" shaped link bars LKB' and the support bars SB, and accordingly, the link bars LKB' may be coupled to the guide rails GRA. The link bars LKB' may move along the guide rails GRA.

Referring to FIG. 24, the first and second guide portions GP1 and GP2 may include a plurality of first protrusions PRT1. The first protrusions PRT1 may each be adjacent to an end of each of the third extension portions EX3 and connected to each of the first and second guide rails GRA1 and GRA2. The first protrusions PRT1 may support ends of the third extensions EX3.

Referring to FIG. 25, the first and second guide portions GP1 and GP2 may include a plurality of second protrusions PRT2. The second protrusions PRT2 may each be adjacent to an end of each of the third extension portions EX3 and connected (i.e., attached) to each of the first and second guide rails GRA1 and GRA2.

The second protrusions PRT2 may each have an "L" shape. The end of each of the third extension portions EX3 may be inserted into a groove GV' defined between each of the first and second guide rails GRA1 and GRA2 and each of the second protrusion portions PRT2. Accordingly, the third extension portions EX3 may be more firmly coupled to the first and second guide portions GP1 and GP2.

According to an embodiment of the invention, guide portions coupled to link bars are disposed further to the inside than the link bars, and a bezel region may thus be reduced. In addition, connecting portions are coupled to the guide portions to cover outer surfaces of the link bars, and separation of the link bars due to external impact may be prevented.

Although the invention has been described with reference to embodiments of the invention, it will be understood that various changes and modifications can be made by those skilled in the art without departing from the spirit and scope of the invention. In addition, the embodiments disclosed in the invention are not intended to limit the technical spirit of the invention, and the scope of the disclosure is not to be limited by the above embodiments but by the claims and the equivalents thereof.

What is claimed is:

1. A display device comprising:
a display module including a first portion and a second portion extending in a first direction from the first portion;
a support plate disposed on a rear surface of the first portion;
a plurality of support bars disposed on a rear surface of the second portion, extending in a second direction crossing the first direction, and arranged in the first direction;
a plurality of link bars connected to first sides and second sides of the support bars, which are opposite to each other in the second direction and extending onto rear surfaces of the support bars; and
a plurality of guide rails disposed further to an inside than the link bars, on the rear surfaces of the support bars, and coupled to the link bars,
wherein each of the guide rails has a closed loop shape when viewed in the second direction, and the link bars move along a portion of the closed loop shape of each of the guide rails.

2. The display device of claim 1, wherein the link bars move along the guide rails.

3. The display device of claim 1, wherein the guide rails comprise:
a first guide rail adjacent to the first sides of the support bars; and
a second guide rail adjacent to the second sides of the support bars.

4. The display device of claim 3, wherein binding grooves facing the first and second guide rails are defined in the link bars, and the first and second guide rails are inserted into the binding grooves.

5. The display device of claim 4, wherein each of the link bars comprises:
a first extension portion extending in a third direction crossing a plane defined by the first and second directions;
a second extension portion extending toward a corresponding guide rail of the plurality of guide rails in the second direction from a portion of the first extension portion; and
a third extension portion extending in the second direction from a lower end of the first extension portion and facing the second extension portion in the third direction, and
wherein each of the binding grooves is defined as a space between the first extension portion, the second extension portion, and the third extension portion.

6. The display device of claim 5, further comprising a first protrusion adjacent to an end of the third extension portion, and attached to each of the first and second guide rails.

7. The display device of claim 5, further comprising a second protrusion adjacent to an end of the third extension portion, and attached to each of the first and second guide rails,
wherein the second protrusion has an "L" shape, and the end of the third extension portion is inserted into a groove defined between each of the first and second guide rails and the second protrusion.

8. The display device of claim 5, wherein a portion of the first extension portion adjacent to an upper end of the first extension portion is connected to one side of a corresponding support bar among the support bars, and the second extension portion is connected to a rear surface of the corresponding support bar adjacent to the one side of the corresponding support bar.

9. The display device of claim 5, wherein each of the support bars comprises:

a first sub support bar extending in the second direction; and a second sub support bar extending in the second direction from each of both sides of the first sub support bar, which are opposite to each other in the second direction, and having a smaller thickness in the third direction than the first sub support bar, and the second sub support bar is disposed on the second extension portion of a corresponding link bar among the link bars and is connected to the first and second extension portions of the corresponding link bar.

10. The display device of claim 3, further comprising a first body portion and a second body portion disposed on the rear surfaces of the support bars and spaced apart in the second direction, wherein the first guide rail protrudes from an outer surface of the first body portion that does not face the second body portion in the second direction, and the second guide rail protrudes from an outer surface of the second body portion that does not face the first body portion in the second direction.

11. The display device of claim 10, wherein the first guide rail protrudes from an edge of the first body portion, and the second guide rail protrudes from an edge of the second body portion.

12. The display device of claim 10, further comprising a plurality of connecting portions spaced apart from the first and second guide rails and connected to the first body portion and the second body portion, respectively.

13. The display device of claim 12, wherein the connecting portions cover outer surfaces of the link bars that do not face the first and second guide rails.

14. The display device of claim 12, further comprising a case accommodating the display module, the support plate, the support bars, the link bars, and the first and second guide rails and defining an opening therein exposing a portion of the display module, wherein the connecting portions are connected to inner surfaces of the case, which face each other in the second direction, respectively.

15. The display device of claim 1, wherein the second portion is folded with respect to a folding axis extending in the second direction, and the support bars and the link bars are arranged along a folded shape of the second portion.

16. The display device of claim 15, wherein the first and second guide rails each comprise:

a first sub rail extending in the first direction;

a second sub rail disposed below the first sub rail and extending parallel to the first sub rail;

a first curved rail extending from a first end of the first sub rail to a first end of the second sub rail, and adjacent to a bending portion defined as a folded portion of the second portion and having a shape corresponding to the bending portion; and a second curved rail extending from a second end of the first sub rail to a second end of the second sub rail and having a shape symmetrical to the first curved rail.

17. The display device of claim 16, wherein the link bars are coupled to the first sub rail, the first curved rail, and the second sub rail to move along the first sub rail, the first curved rail, and the second sub rail.

18. A display device comprising:

a display module including a first portion and a second portion extending in a first direction from the first portion;

a support plate disposed on a rear surface of the first portion;

a plurality of support bars disposed on a rear surface of the second portion;

a plurality of link bars connected to opposite sides of the support bars and extending onto rear surfaces of the support bars; and a plurality of guide rails disposed further to an inside than the link bars, on the rear surfaces of the support bars, and having a portion in a curved shape, wherein the guide rails are inserted into binding grooves defined in the link bars.

19. A display device comprising:

a display module including a first portion and a second portion extending in a first direction from the first portion;

a support plate disposed on a rear surface of the first portion;

a plurality of support bars disposed on a rear surface of the second portion, extending in a second direction crossing the first direction, and arranged in the first direction;

a plurality of link bars connected to rear surfaces of the support bars;

a plurality of body portions disposed on the rear surfaces of the support bars; and a plurality of guide rails protruding from both sides of the body portions, which are opposite to each other in the second direction, wherein the link bars are coupled to the guide rails to move along the guide rails.

* * * * *